US009834640B2

(12) United States Patent
McCairn et al.

(10) Patent No.: US 9,834,640 B2
(45) Date of Patent: Dec. 5, 2017

(54) NANOPARTICLES

(71) Applicant: The University of Manchester, Manchester (GB)

(72) Inventors: Mark McCairn, Rochdale (GB); Michael Turner, Sale (GB); Duangratchaneekorn Muenmart, Sisaket (TH); Jair Azael Esquivel Guzman, Manchester (GB); Jonathan Maxmillian Behrendt, Bedford (GB); Andrew Bryan Foster, Sale (GB)

(73) Assignee: Chromition Limited, Stockport (GB)

( * ) Notice: Subject to any disclaimer, the term of this patent is extended or adjusted under 35 U.S.C. 154(b) by 0 days.

(21) Appl. No.: 15/027,987

(22) PCT Filed: Oct. 10, 2014

(86) PCT No.: PCT/GB2014/053048
§ 371 (c)(1),
(2) Date: Apr. 7, 2016

(87) PCT Pub. No.: WO2015/052529
PCT Pub. Date: Apr. 16, 2015

(65) Prior Publication Data
US 2016/0237205 A1    Aug. 18, 2016

(30) Foreign Application Priority Data
Oct. 10, 2013    (GB) .................................... 1317966.8

(51) Int. Cl.
| | |
|---|---|
| H01L 51/00 | (2006.01) |
| C08G 61/12 | (2006.01) |
| C08J 3/12 | (2006.01) |
| H01B 1/12 | (2006.01) |
| C08G 61/02 | (2006.01) |
| C09D 165/00 | (2006.01) |
| H01L 51/05 | (2006.01) |
| B82Y 30/00 | (2011.01) |

(52) U.S. Cl.
CPC ........... *C08G 61/126* (2013.01); *C08G 61/02* (2013.01); *C08G 61/121* (2013.01); *C08G 61/123* (2013.01); *C08G 61/124* (2013.01); *C08J 3/12* (2013.01); *H01B 1/124* (2013.01); *H01L 51/0003* (2013.01); *H01L 51/0026* (2013.01); *H01L 51/0036* (2013.01); *H01L 51/0039* (2013.01); *H01L 51/0043* (2013.01); *B82Y 30/00* (2013.01); *C08G 2261/12* (2013.01); *C08G 2261/124* (2013.01); *C08G 2261/1412* (2013.01); *C08G 2261/18* (2013.01); *C08G 2261/3142* (2013.01); *C08G 2261/3162* (2013.01); *C08G 2261/3223* (2013.01); *C08G 2261/3241* (2013.01); *C08G 2261/3243* (2013.01); *C08G 2261/3246* (2013.01); *C08G 2261/411* (2013.01); *C08G 2261/414* (2013.01); *C08G 2261/91* (2013.01); *C08G 2261/92* (2013.01); *C08J 2300/12* (2013.01); *C08J 2365/00* (2013.01); *C09D 165/00* (2013.01); *H01L 51/0541* (2013.01); *H01L 51/0566* (2013.01); *H01L 51/0575* (2013.01); *Y02E 10/549* (2013.01)

(58) Field of Classification Search
CPC ............... H01L 51/0036; H01L 51/006; H01L 2251/5369; Y10S 977/773
See application file for complete search history.

(56) References Cited

U.S. PATENT DOCUMENTS

| | | | |
|---|---|---|---|
| 2004/0044214 A1 | 3/2004 | Andriessen | |
| 2004/0254297 A1 | 12/2004 | Hsu et al. | |
| 2005/0175861 A1 | 8/2005 | Elschner et al. | |
| 2005/0208328 A1* | 9/2005 | Hsu ........................ | B82Y 10/00 428/690 |
| 2005/0234280 A1 | 10/2005 | Wittmann et al. | |
| 2008/0017852 A1 | 1/2008 | Huh et al. | |
| 2008/0023674 A1 | 1/2008 | Jiang et al. | |
| 2008/0166564 A1 | 7/2008 | Rostovtsev et al. | |
| 2010/0290999 A1* | 11/2010 | Kim .................. | A61K 49/0093 424/9.6 |
| 2011/0257277 A1 | 10/2011 | Elschner et al. | |
| 2012/0104374 A1 | 5/2012 | Allemand | |
| 2013/0126790 A1 | 5/2013 | Hsu et al. | |
| 2013/0193381 A1 | 8/2013 | Hsu et al. | |

FOREIGN PATENT DOCUMENTS

| | | |
|---|---|---|
| JP | 2008074894 A | 4/2008 |
| WO | 20120170643 A1 | 12/2012 |

OTHER PUBLICATIONS

CN 102627776, Liu et al, published on Aug. 2012.*
Behrendt, J.M. et al., Hybrid inorganic-organic composite nanoparticles from crosslinkable polyfluorenes, Journal of Materials Chemistry C, 2013,vol. 1, pp. 3297-3304.
UK Search Report dated Apr. 10, 2014 for GB1317966.8, 2 pages.
International Search Report and Written Opinion dated Mar. 10, 2015 for PCT/GB2014/053048, 9 pages.

* cited by examiner

*Primary Examiner* — Gregory Listvoyb
(74) *Attorney, Agent, or Firm* — Linda B. Huber; Nixon Peabody LLP

(57) ABSTRACT

The present invention relates to nanoparticles of π-conjugated polymers. The present invention also relates to an aqueous composition comprising these polymeric nanoparticles, to processes for making the nanoparticles, and to the use of these nanoparticles in the fabrication of electronic devices and components.

19 Claims, 3 Drawing Sheets

NANOPARTICLES

CROSS-REFERENCE TO RELATED APPLICATIONS

This application is the National Phase of International Application PCT/GB2014/053048, filed Oct. 10, 2014, which designated the United States and that International Application was published under PCT Article 21(2) in English. This application also includes a claim of priority under 35 U.S.C. §119(a) and §365(b) to British patent application No. GB 1317966.8, filed Oct. 10, 2013, the entirety of which is hereby incorporated by reference.

FIELD OF THE INVENTION

The present invention relates to nanoparticles. More specifically, the present invention relates to nanoparticles of π-conjugated polymers. The present invention also relates to an aqueous composition comprising these polymeric nanoparticles, to processes for making the nanoparticles, and to the use of these nanoparticles in the fabrication of electronic devices and components.

BACKGROUND OF THE INVENTION

Π-conjugated materials have attracted considerable attention because they offer the potential for lower cost and more flexible approaches for the fabrication of components or devices, such as, for example, organic thin film transistors/organic field-effect transistors (OTFT/OFET), organic photovoltaic solar cells (OPV) or organic light emitting diodes (OLED).

The drive to use these materials stems from the fact that π-conjugated materials are much less expensive to generate compared to highly crystalline inorganic semi-conductors. The π-conjugated materials can also be used to make devices with relatively inexpensive fabrication methods. In particular, most organic materials used in device fabrication are soluble in one or more common organic solvent and this allows for the possibility of solution processing which can produce many devices at a fraction of the cost. Additionally, most devices require an annealing step to reach high performance that is generally at high temperatures (at least 500° C. for silicon), but the temperature required is much lower for organic semi-conductor materials. The lower annealing temperatures of organic materials allows for flexibility in the choice of substrate for organic devices, and thereby enables the use of materials such as transparent plastics that could not withstand the high annealing temperature of silicon.

One disadvantage with current techniques for the fabrication of organic semi-conductor and photovoltaic devices is that organic solvents commonly used in the fabrication process have associated health and safety issues in the work place and environmental issues relating to safe storage and disposal.

Furthermore, although the processing temperatures required are lower than for inorganic semi-conductor materials, often temperatures approaching or in excess of 100° C. are still utilised during the fabrication processes for organic semi-conductor and photovoltaic devices.

There is therefore a need for improved techniques for the fabrication of organic semi-conductive and photovoltaic devices that are effective, safe (i.e. they obviate the need to use harmful organic solvents) and that enable lower processing temperatures to be used.

SUMMARY OF THE INVENTION

The present invention resides in the recognition that the nanoparticles of π-conjugated polymers can be used in aqueous media for the fabrication of the organic semi-conductive and photovoltaic devices or components. The use of aqueous media circumvents the need to use harsh organic solvents during the fabrication of the organic semi-conductive and photovoltaic devices or components. Furthermore, the fabrication processes of the present invention also enable organic semi-conductive and photovoltaic devices to be fabricated from polymers that are not sufficiently soluble in organic solvents.

The present invention therefore provides an aqueous composition comprising a plurality of nanoparticles dispersed in an aqueous medium, wherein:
(i) the nanoparticles are formed from one or more non-cross-linked organic π-conjugated polymers;
(ii) the nanoparticles have a particle size of less than 400 nm; and
(iii) the concentration of the nanoparticles in the aqueous medium is greater than or equal to 12 mM;
and wherein the non-cross-linked organic π-conjugated polymers do not comprise any carbon-carbon triple bonds.

The present invention further provides an aqueous composition comprising a plurality of nanoparticles dispersed in an aqueous medium, wherein:
(i) the nanoparticles comprise a core formed from one or more non-cross-linked organic π-conjugated polymers;
(ii) the nanoparticles have a particle size of less than 400 nm; and
(iii) the concentration of the nanoparticles in the aqueous medium is greater than or equal to 12 mM;
and wherein the non-cross-linked organic π-conjugated polymers are intrinsic semiconductors that do not comprise any carbon-carbon triple bonds.

In a further aspect, the present invention provides a method of forming an aqueous composition as defined herein, said method comprising:
(i) forming the nanoparticles by emulsion or miniemulsion polymerisation techniques to form an aqueous suspension of nanoparticles; and
(ii) optionally purifying the nanoparticle suspension.

Suitably, the nanoparticles are formed by a Stille or Suzuki polymerisation reaction.

In a further aspect, the present invention provides nanoparticles comprising one or more non-cross-linked π-conjugated polymers, wherein:
(i) the nanoparticles comprise one or more non-cross-linked π-conjugated polymers having a solubility in an organic solvent [e.g. chlorobenzene] of less than 10 mg/ml; and
(ii) the nanoparticles have a particle size of less than 400 nm.

In a further aspect, the present invention provides a method of forming nanoparticles as defined herein, said method comprising:
(i) forming the nanoparticles by emulsion or miniemulsion polymerisation techniques to form a suspension of nanoparticles;
(ii) optionally purifying the nanoparticle suspension to remove one or more reaction by-products; and/or
(iii) optionally isolating the nanoparticles.

Suitably, the nanoparticles are formed by a Stille or Suzuki polymerisation reaction.

In a further aspect, the present invention provides a process for preparing an organic semi-conductor or photovoltaic device or component, said method comprising:

(i) depositing an aqueous composition comprising nanoparticles as defined herein onto a substrate; and
(ii) heating the substrate to a temperature above the glass transition temperature (Tg) of the nanoparticles to form a film of organic π-conjugated polymer on the substrate.

In a further aspect, the present invention provides a π-conjugated film obtainable by, obtained by or directly obtained by the process defined herein.

In a further aspect, the present invention provides the use of an aqueous composition or nanoparticles as defined herein for the preparation of an organic semi-conductor or photovoltaic device or component.

In a further aspect, the present invention provides an organic semi-conductor or photovoltaic device or component obtainable by, obtained by or directly obtained by a process as defined herein.

In a further aspect, the present invention provides an organic semi-conductor or photovoltaic device or component comprising an organic semi-conductive film as defined herein.

DETAILED DESCRIPTION OF THE INVENTION

Definitions

Unless otherwise stated, the following terms used in the specification and claims have the following meanings set out below.

References to "organic" include organic and organometallic materials. For example, references to "organic π-conjugated polymers" includes both organic π-conjugated polymers and organo-metallic π-conjugated polymers.

References to "intrinsic semiconductor(s)" herein refers to an almost pure semiconductor to which no impurities have been added and in which the electron and hole densities are equal at thermal equilibrium. Intrinsic semiconductors are also known in the art as i-type semiconductors or undoped semiconductors, i.e. a pure semiconductor without any significant dopant species present.

References to "particle size" herein refer to either number or z-average particle size, when determined by dynamic light scattering techniques, such as, for example, using a Malvern Zetasizer. Number average particle sizes are quoted when referring to transmission electron microscopy (TEM) analysis.

References herein to the Stille reaction (also known as Stille coupling) refer to a well-known chemical reaction coupling involving an organotin compound with an sp²-hybridized organic halide catalyzed by palladium. The reaction is widely used in organic synthesis. The use of Stille polymerisation reactions for the production of conjugated polymer systems is described in, for example, Chem. Rev. 2011, 111, 1493-1528. The general reaction scheme is shown below:

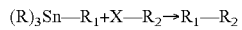

wherein
R is a hydrocarbyl substituent group, such as (1-6C)alkyl;
$R_1$ and $R_2$ are both π-conjugated monomeric units of the non-crosslinked organic semi-conductive polymers defined herein, or $R_1$ and $R_2$ together ($R_1$-$R_2$) form a π-conjugated monomeric unit of the non-crosslinked organic semi-conductive polymer; and
X is reactive group, typically a halide, such as Cl, Br, I, or a pseudohalide, such as a triflate, $CF_3SO_3^-$.

References to the "Suzuki reaction" refer to the well-known organic reaction of an aryl- or vinyl-boronic acid with an aryl- or vinyl-halide. Suzuki reactions are typically catalyzed by a palladium(0) complex catalyst. This reaction is well known in the chemical field and follows the general reaction scheme shown below:

Scheme 2

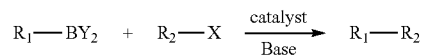

The reaction also works with pseudohalides, such as triflates (OTf), instead of halides. Boronic esters and organotrifluoroborate salts may be used instead of boronic acids. For polymer synthesis, $R_1$ and $R_2$ will represent monomeric units.

The term "alkyl" includes both straight and branched chain alkyl groups. References to individual alkyl groups such as "propyl" are specific for the straight chain version only and references to individual branched chain alkyl groups such as "isopropyl" are specific for the branched chain version only. For example, "(1-20C)alkyl" includes (1-14C)alkyl, (1-12C)alkyl, propyl, isopropyl and t-butyl. A similar convention applies to other radicals mentioned herein.

The terms "alkenyl" and "alkynyl" include both straight and branched chain alkenyl and alkynyl groups.

The term "halo" refers to fluoro, chloro, bromo and iodo.

The term "fluoroalkyl" means an alkyl group as defined herein which is substituted with one or more fluoro atoms, e.g. —$CF_3$, or —$CH_2CF_3$ and the like.

The term "aryl" is used herein to denote phenyl, naphthalene or anthracene ring. In an embodiment, an "aryl" is phenyl or naphthalene, and particularly is phenyl.

The term "heteroaryl" or "heteroaromatic" means an aromatic mono-, bi-, or tri-cyclic ring incorporating one or more (for example 1-4, particularly 1, 2 or 3) heteroatoms selected from N, O, S, Si or Se. Examples of heteroaryl groups are monocyclic, bicyclic and tricyclic groups containing from five to eighteen ring members. The heteroaryl group can be, for example, a 5- or 6-membered monocyclic ring, a 8-, 9- or 10-membered bicyclic ring or a 15-, 16-, 17- or 18-membered tricyclic ring. Suitably each ring in a bicyclic or tricyclic ring system comprises five or six ring atoms.

The term "heterocyclyl", "heterocyclic" or "heterocycle" means a non-aromatic saturated or partially saturated monocyclic, fused, bridged, or Spiro bicyclic heterocyclic ring system(s). The term heterocyclyl includes both monovalent species and divalent species. Monocyclic heterocyclic rings contain from about 3 to 12 (suitably from 3 to 7) ring atoms, with from 1 to 5 (suitably 1, 2 or 3) heteroatoms selected from nitrogen, oxygen or sulfur in the ring. Bicyclic heterocycles contain from 7 to 17 member atoms, suitably 7 to 12 member atoms, in the ring. Bicyclic heterocycles contain from about 7 to about 17 ring atoms, suitably from 7 to 12 ring atoms. Bicyclic heterocyclic(s) rings may be fused, spiro, or bridged ring systems. As the skilled person would appreciate, any heterocycle may be linked to another group via any suitable atom, such as via a carbon or nitrogen atom.

The term "polymerisable group" is used herein to refer to any functional group that can be polymerized. Examples of such groups include oxirane, oxetane, acrylate, methacrylate, styrene or a heteroaryl group (especially thiophene) which is optionally substituted by (1-20C)alkyl.

Aqueous Compositions

As previously indicated, the present invention provides an aqueous composition comprising a plurality of nanoparticles dispersed in an aqueous medium, wherein:
(i) the nanoparticles comprise one or more non-cross-linked π-conjugated polymers;
(ii) the nanoparticles have a particle size of less than 400 nm; and
(iii) the concentration of the nanoparticles in the aqueous medium is greater than or equal to 12 mM.

In another aspect, the present invention provides an aqueous composition comprising a plurality of nanoparticles dispersed in an aqueous medium, wherein:
(i) the nanoparticles comprise a core formed from one or more non-cross-linked organic π-conjugated polymers;
(ii) the nanoparticles have a particle size of less than 400 nm; and
(iii) the concentration of the nanoparticles in the aqueous medium is greater than or equal to 12 mM;
and wherein the non-cross-linked organic π-conjugated polymers are intrinsic semi-conductors that do not comprise any carbon-carbon triple bonds.

Suitably, the core of the nanoparticles does not comprise any polymeric acid or polyanionic components.

In an embodiment, the cores of the nanoparticles consist essentially of the one or more non-cross-linked organic π-conjugated polymers defined herein.

In a further embodiment, the cores of the nanoparticles consist of the one or more non-cross-linked organic π-conjugated polymers defined herein (i.e. they are formed only from the non-cross-linked organic π-conjugated polymer(s) and no other polymeric material is present in the core of the nanoparticle).

Suitably, the polymeric backbone of the non-cross-linked organic π-conjugated polymer(s) is uncharged. More suitably, the entire non-cross-linked organic π-conjugated polymer is uncharged.

The nanoparticle core may be surrounded by a suitable stabiliser coating, e.g. a surfactant or emulsifying agent that serves to keep the nanoparticles dispersed or readily dispersible within the aqueous composition.

The nanoparticles comprise one or more non-cross-linked π-conjugated polymers. Any suitable π-conjugated polymer capable of forming nanoparticles may be used.

Suitably, the π-conjugated polymers of the present invention do not comprise any carbon-carbon triple bonds. Thus, in one aspect, the present invention relates to π-conjugated polymers that do not comprise any carbon-carbon triple bonds. The electrons in a carbon-carbon triple bond give rise to conformations in which the π-electrons are not fully delocalised.

It will be appreciated by those skilled in the art that the monomeric units used to form the non-cross-linked π-conjugated polymers may comprise a selection of different chemical moieties that either alone or in combination provide a monomer having a π-conjugated ring system.

Examples of suitable π-conjugated ring systems that may be present in the monomer units, either alone or in any suitable combination, include mono-cyclic aryl groups (e.g. phenyl rings), polycyclic aryl ring systems (e.g. fluorene ring systems, naphthyl rings), mono-cyclic heteroaryl rings (e.g. thiophene rings) or polycyclic heteroaryl ring systems (e.g. benzothiazole, benzodiazathazole rings, thieno[3,2-b] thiophene, or pyrrolo[3,4-c]pyrrole) or other conjugated heterocyclic rings systems (e.g. pyrrolo-pyrrole-1,4-dione rings), and wherein each moiety is optionally substituted by one or more organic groups, e.g. hydrocarbyl substituent groups optionally comprising 1 to 30 carbon atoms and optionally comprising one or more heteroatoms (e.g. N, O, S, Si, or P), and, where two or more of such moieties are present, they may be linked together by a bond or via an amine linkage (e.g. such as in a bi-arylamine or tri-arylamine group).

Further examples of particular π-conjugated moieties that may be present in the monomers or polymers of the present invention include:

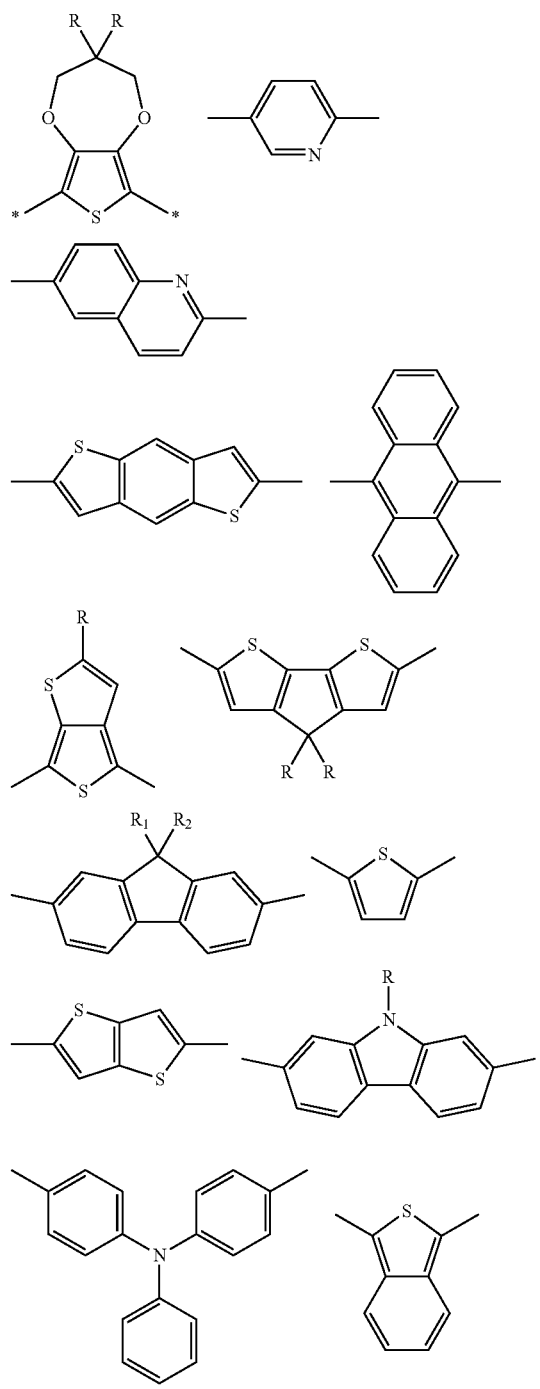

-continued

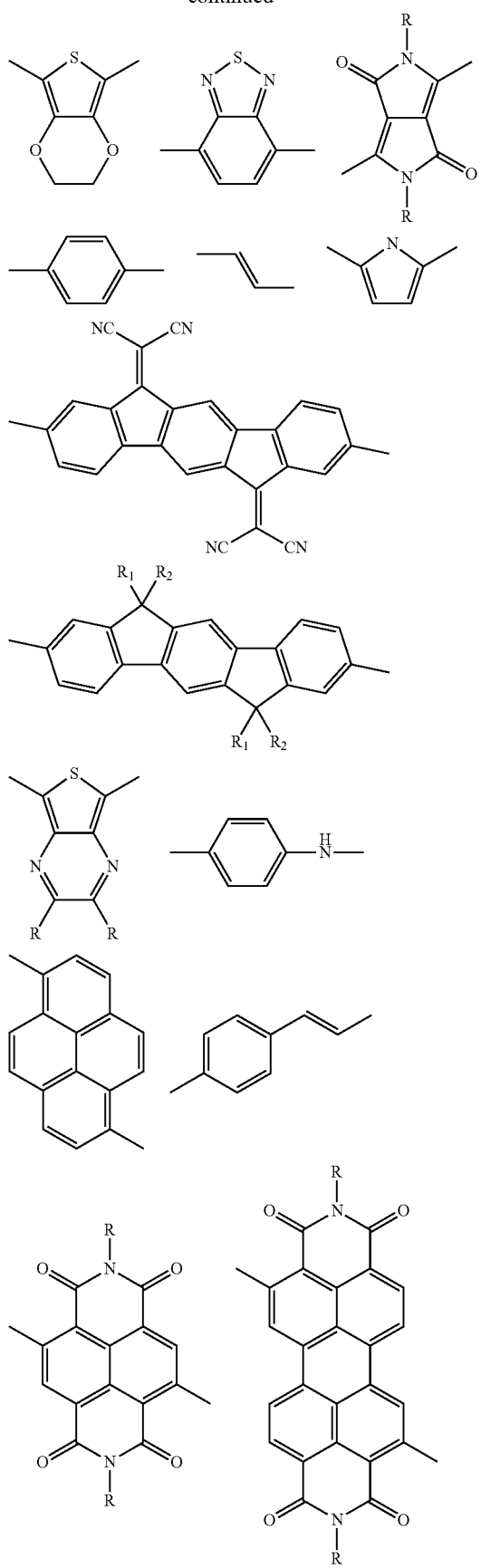

wherein R, $R_1$ and $R_2$ are each independently hydrogen or an organic substituent group (e.g. a hydrocarbyl substituent group optionally comprising 1 to 30 carbon atoms and optionally comprising one or more heteroatoms (e.g. N, O, S, Si, or P), or an aromatic or heteroaromatic group);

M is a metal (e.g. Ir, Pt, Rh, Re, Ru, Os, Cr, Cu, Pd, or Au);

L is a ligand (e.g. a halide or a hydrocarbyl substituent group optionally comprising 1 to 30 carbon atoms and optionally comprising one or more heteroatoms (e.g. N, O, S, Si, or P) or an aromatic or hetroaromatic group);

and wherein each of the above structures is optionally further substituted with one or more organic substituent groups (e.g. a hydrocarbyl substituent groups optionally comprising 1 to 30 carbon atoms and optionally comprising one or more heteroatoms (e.g. N, O, S, Si, or P) or an aromatic or hetroaromatic group).

It will be appreciated that these moieties may be used alone or in a variety of different combinations in order to provide monomeric units of a non-cross-linked organic rt-conjugated polymer defined herein.

In an embodiment, the organic substituent groups are selected from the group consisting of (1-20C)alkyl, (2-20C)alkenyl, (2-20C)alkynyl, (2-20C)alkanoyl, or (1-20C)alkyl-$SO_2$—; or a group $$-Z^1-Q^1$$

wherein
$Z^1$ is a direct bond, —CO— or $SO_2$—; and
$Q^1$ is selected from aryl, heteroaryl, heterocyclyl, (3-8C)cycloalkyl, aryl-(1-10C)alkyl, heteroaryl-(1-10C)alkyl, heterocyclyl-(1-10C)alkyl, or (3-8C)cycloalkyl-(1-10C)alkyl; and wherein each (1-20C)alkyl, (2-20C)alkenyl, (2-20C)alkynyl, (2-20C)alkanoyl, (1-20C)alkyl-$SO_2$—, or group $Q^1$ is optionally further substituted by one or more substituents selected from halo, nitro, cyano, hydroxy, (1-20C)alkyl, (1-10C)fluoroalkyl(1-10C)fluoroalkoxy, amino, carboxy, carbamoyl, mercapto, sulfonylamino, (1-10C)alkoxy, (2-10C)alkanoyl, (1-10C)alkanoyloxy.

In a particular embodiment, the non-cross-linked π-conjugated polymer comprises monomeric units selected from the group consisting of one or more of the following:

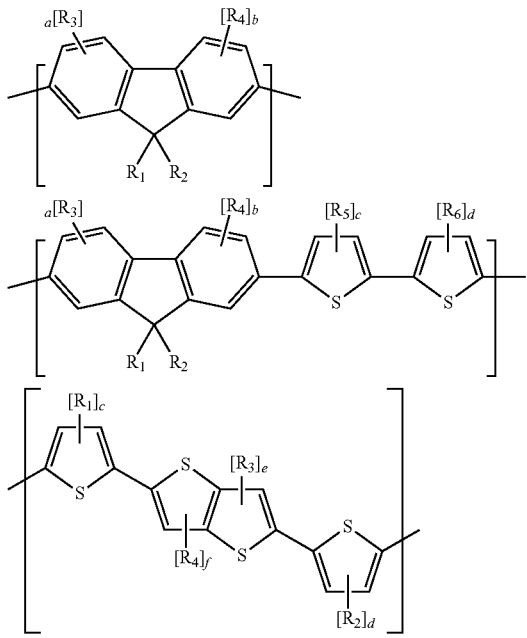

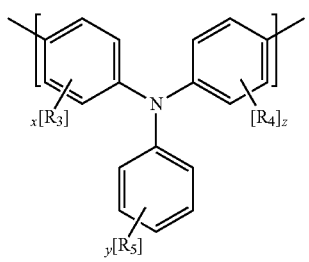

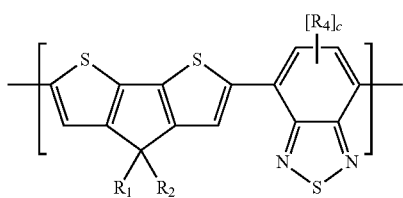

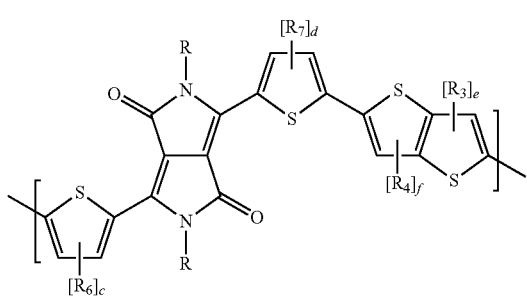

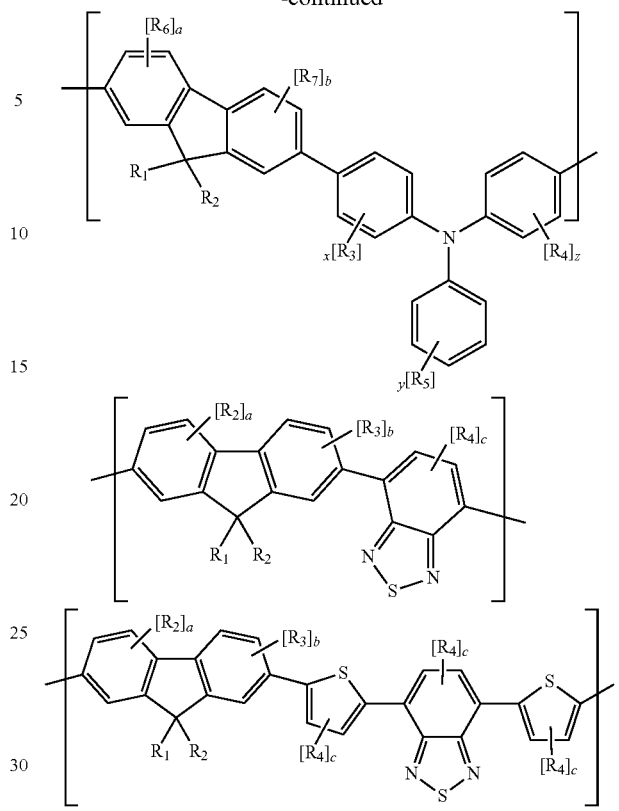

wherein R, $R_1$, $R_2$, $R_3$, $R_4$, $R_5$, $R_6$ and $R_7$ are each independently selected from hydrogen or a hydrocarbyl substituent group comprising 1 to 30 carbon atoms and optionally comprising one or more heteroatoms (e.g. N, O, S, Si, or P);

a is 0, 1, 2 or 3; b is 0, 1, 2 or 3; c and d are 0, 1 or 2; e and f are 0 or 1; x is 0, 1, 2, 3 or 4;

y is 0, 1, 2, 3 or 4; and z is 0, 1, 2, 3 or 4.

The non-cross-linked π-conjugated polymer that forms the nanoparticles suitably has a degree of polymerization of between 10 and 1000.

In an embodiment, R, $R_1$, $R_2$, $R_3$, $R_4$, $R_5$, $R_6$ and $R_7$ are each independently selected from hydrogen, (1-20C)alkyl, (2-20C)alkenyl, (2-20C)alkynyl, (2-20C)alkanoyl, (1-20C)alkyl-$SO_2$—; or a group $$-Z^1-Q^1$$

wherein $Z^1$ is a direct bond, —CO— or $SO_2$—; and $Q^1$ is selected from aryl, heteroaryl, heterocyclyl, (3-8C)cycloalkyl, aryl-(1-10C)alkyl, heteroaryl-(1-10C)alkyl, heterocyclyl-(1-10C)alkyl, or (3-8C)cycloalkyl-(1-10C)alkyl; and and wherein each (1-20C)alkyl, (2-20C)alkenyl, (2-20C)alkynyl, (2-20C)alkanoyl, (1-20C)alkyl-$SO_2$—, or group $Q^1$ is optionally further substituted by one or more substituents selected from halo, nitro, cyano, hydroxy, (1-20C)alkyl, (1-10C)fluoroalkyl (1-10C)fluoroalkoxy, amino, carboxy, carbamoyl, mercapto, sulfonylamino, (1-10C)alkoxy, (2-10C)alkanoyl, (1-10C)alkanoyloxy.

In a further embodiment, R, $R_1$, $R_2$, $R_3$, $R_4$, $R_5$, $R_6$ and $R_7$ are each independently selected from hydrogen or (1-20C)alkyl.

In a particular embodiment, R, $R_1$, $R_2$, $R_3$, $R_4$, $R_5$, $R_6$ and $R_7$ are all (1-20C)alkyl, when present.

In a further embodiment, the non-cross-linked π-conjugated polymer comprises monomeric units selected from the group consisting of one or more of the following:

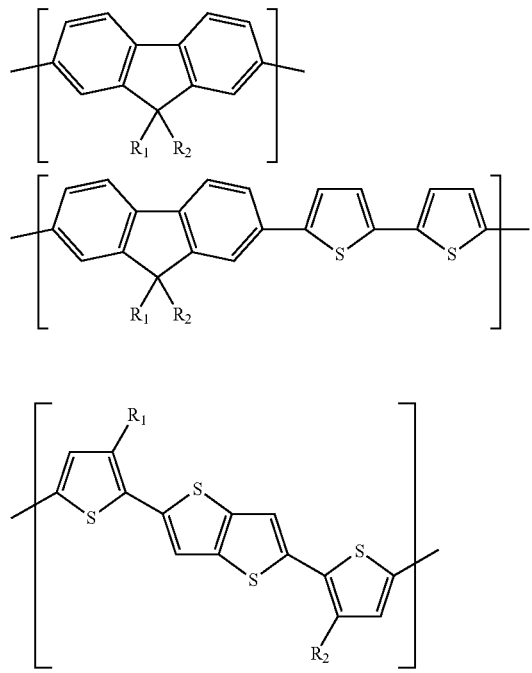

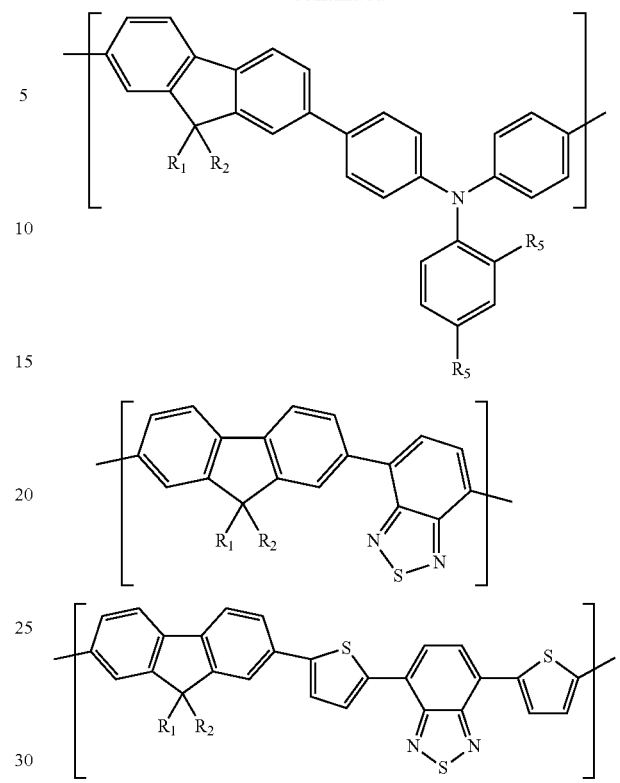

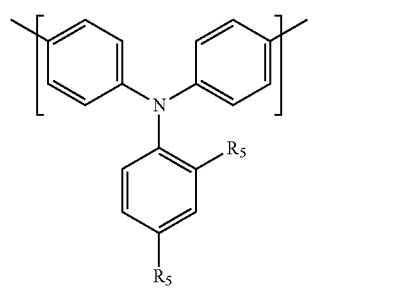

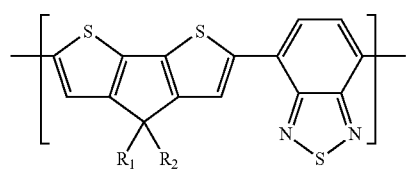

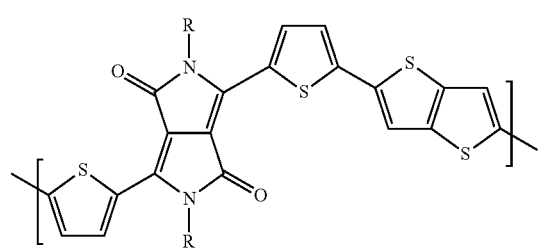

wherein each R, $R_1$, $R_2$ and $R_5$ group present is independently as defined hereinbefore.

In this embodiment, the degree of polymerisation is suitably between 10 and 1000.

In a further embodiment, the non-cross-linked π-conjugated polymer comprises monomeric units selected from the group consisting of one or more of the following:

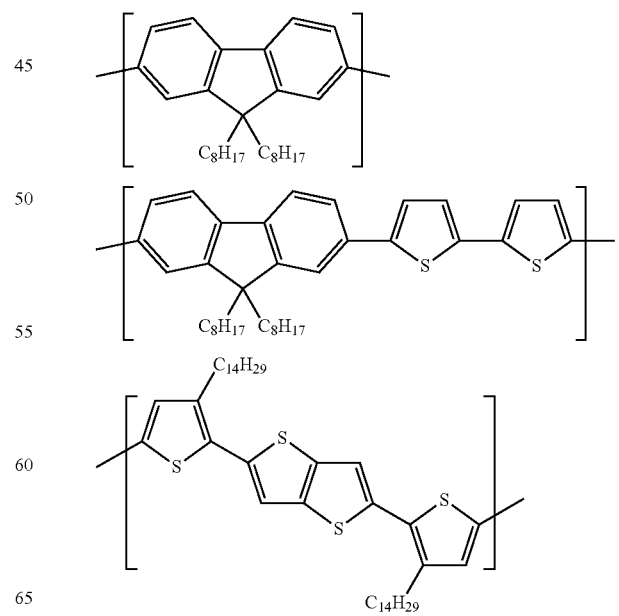

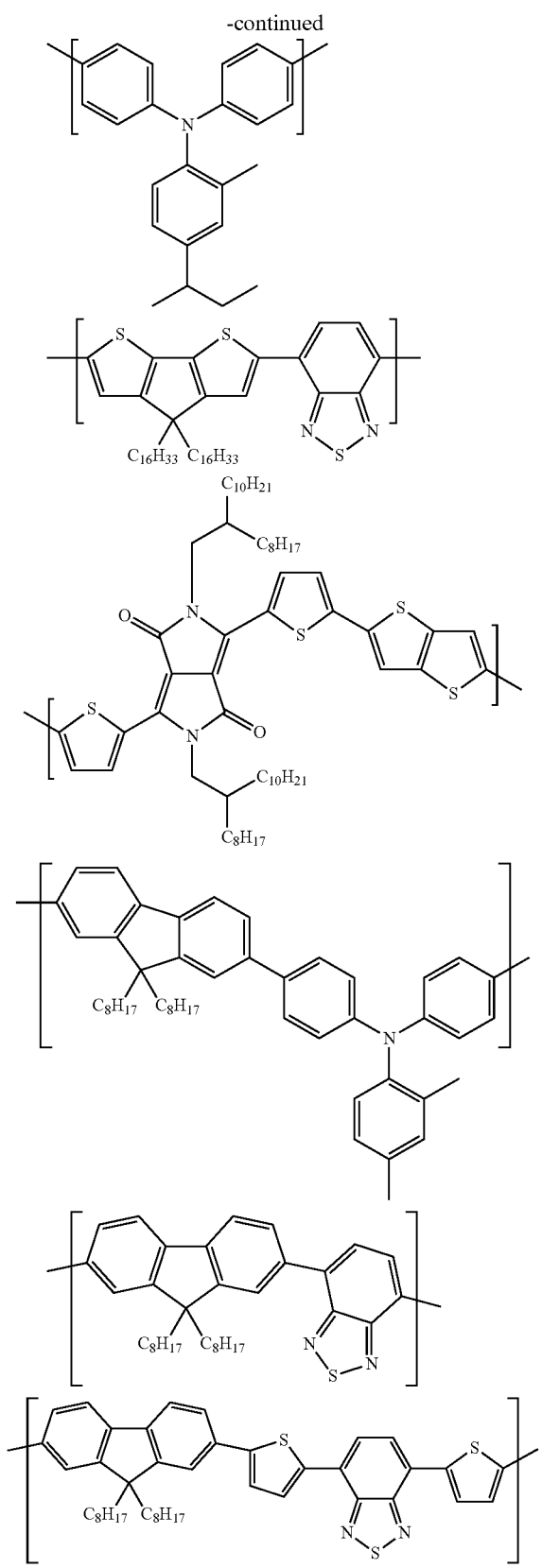

The aqueous medium provides a water-based vehicle in which the nanoparticles are dispersed. The medium may comprise additional components, such as dissolved materials and other water-miscible solvents. In a particular embodiment, however, the aqueous medium is water, particularly purified water.

Suitably, the nanoparticles have a particle size of less than 300 nm and more suitably less than 250 nm.

In an embodiment, the size of the nanoparticles is within the range of 30 to 400 nm.

In another embodiment, the size of the nanoparticles is within the range of 30 to 300 nm.

In a further embodiment, the size of the nanoparticles is within the range of 50 to 250 nm.

In another embodiment, the size of the nanoparticles is within the range of 100 to 250 nm.

The concentrations quoted herein for the concentration of nanoparticles are based on the initial monomer concentrations used in the polymerisation reaction and assumes 100% conversion of the monomer to the polymer.

In a further embodiment, the concentration of the nanoparticles in the aqueous medium is greater than or equal to 15 mM. In a further embodiment, the concentration of the nanoparticles in the aqueous medium is greater than or equal to 20 mM. In a further embodiment, the concentration of the nanoparticles in the aqueous medium is greater than or equal to 25 mM.

In the polymers of the present invention, the degree of polymerisation is suitably between 20 and 800, more suitably 30 to 600.

In an embodiment, the aqueous composition of the invention further comprises a stabiliser to maintain the particles in suspension. Any suitable stabiliser may be used such as, for example, non-ionic, cationic or anionic stabilisers known in the art. Particular examples of suitable stabilisers include non-ionic stabilisers, for example:

Triton X series octylphenol ethoxylates, Tergitol series nonylphenol ethoxylates (Dow Chemical Company);

Brij series poly(oxyethylene) glycol alkyl ethers, Superonic series, Tween series polysorbate surfactants (Croda);

Pluronic series of block copolymers based on ethylene oxide and propylene oxide (BASF);

Tetronic series tetra functional block copolymers based on ethylene oxide and propylene oxide, Lutensol series (BASF);

Igepal series Rhodasurf series and Antarox series (Rhodia);

Merpol series (Stepan Co.);

an anionic stabilisers, for example sodium dodecylsuplhate (SDS);

or a cationic stabiliser, for example cetyl trimethylammonium bromide (CTAB).

Preparation of the Aqueous Compositions of the Invention

In a further aspect, the present invention provides a method of forming an aqueous composition as defined herein, said method comprising:

(i) forming the nanoparticles by emulsion polymerisation or mini-emulsion polymerisation techniques in an aqueous medium to form an aqueous suspension of nanoparticles; and (ii) optionally purifying the nanoparticle suspension.

The nanoparticles of the present invention may be formed by any suitable techniques known in the art. Suitably, the nanoparticles are prepared by emulsion polymerisation or dispersion polymerisation techniques. Such techniques may use standard polymerisation reactions known in the art.

In the case of emulsion polymerisation, the monomeric components are dissolved in a suitable organic solvent (e.g. chlorobenzene, toluene or xylenes) along with the catalyst (e.g. Pd(PPh$_3$)$_4$, IPr*PdTEACl$_2$ or Pd$_2$(dba)$_3$/P(o-tol)$_3$). This solution is then added to an aqueous medium of water and a suitable emulsifier. Any suitable emulsifier may be used, such as, for example, SDS, Triton X102, Brij L23, and/or Tween 20. The resultant emulsion may be stirred and/or ultrasonicated to form an emulsion, suitably a miniemulsion. The emulsion mixture may then be gently heated to a temperature of between 30 and 100° C. (for Pd(PPh$_3$)$_4$, Pd$_2$(dba)$_3$/P(o-tol)$_3$ suitably between 70 and 95° C., and more suitably between 80 and 95° C.; and for IPr*PdTEACl$_2$ ideally 30° C.) for period of time (e.g. from 1 hour to 2 days) to form the organic semi-conducting polymeric nanoparticles. A person skilled in the art will appreciate that the temperature of heating depends on catalyst system employed (as per the example section herein).

In an embodiment, the nanoparticles are formed by either Stille or Suzuki coupling reactions. Such coupling reactions are known in the art.

In step (ii) the aqueous suspension of nanoparticles formed following the emulsion or miniemulsion polymerisation reaction is optionally purified to remove any undesired component, e.g. the catalyst, unreacted reactants, surfactants used to stabilise the emulsion/dispersion etc. Suitably, this purification step is employed in the process. Any suitable purification technique known in the art may be used. For example, the suspension may be subject to metal scavenging procedures known in the art to remove metallic reagents that are present following the polymerisation reaction (e.g. catalysts). This may achieved by, for example, contacting the suspension from step (i), or the purified suspension from step (ii), with a mixture of SiliaMetS Thiourea and SiliaMetS TAAcONa. Dialysis and ultrafiltration techniques may also be used to remove certain components, e.g. any surfactant present.

In an embodiment, the nanoparticles may be separated or isolated from the aqueous suspension by any suitable separation technique known in the art. Suitably, the nanoparticles are separated from the suspension by centrifugation. The isolated nanoparticles may then be re-dispersed in the desired aqueous medium.

Nanoparticles

In another aspect, the present invention provides nanoparticles comprising one or more non-cross-linked organic π-conjugated polymers, wherein:
(i) the nanoparticles comprise one or more non-cross-linked organic π-conjugated polymers having a solubility in an organic solvent [e.g. chlorobenzene] of less than 10 mg/ml; and
(ii) the nanoparticles have a particle size of less than 400 nm.

The nanoparticles comprise one or more organic π-conjugated polymers having low organic solvent solubility, i.e. a solubility of less than 10 mg/ml in an organic solvent (e.g. chlorobenzene at room temperature). Any suitable π-conjugated polymer meeting this criteria may be used.

In an embodiment, the non-cross-linked organic π-conjugated polymers having low organic solubility have a solubility of less than 5 mg/ml in an organic solvent (e.g. chlorobenzene at room temperature).

In an embodiment, the non-cross-linked organic π-conjugated polymers having low organic solubility have a solubility which is less than 1 mg/ml in an organic solvent (e.g. chlorobenzene at room temperature).

In a particular embodiment, the monomeric units present in the non-cross-linked organic π-conjugated polymers are:

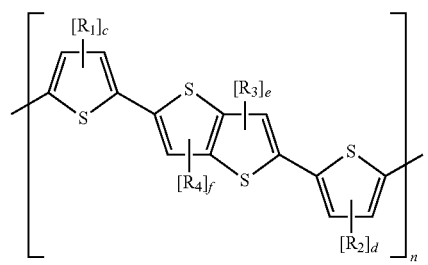

wherein R$_1$, R$_2$, R$_3$, R$_4$, n, c, d, e, and f are as defined hereinbefore.

In a further embodiment, the monomeric units present in the non-cross-linked organic semi-conductive polymers have the following structural formula:

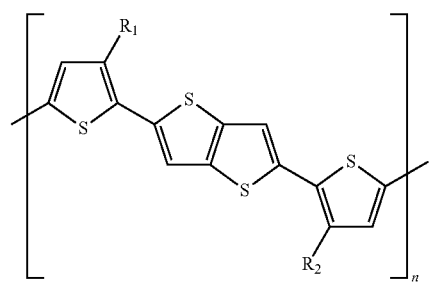

wherein R$_1$ and R$_2$ are as defined hereinbefore; and n is as defined hereinbefore.

In a further embodiment, the monomeric units present in the non-cross-linked organic semi-conductive polymers are:

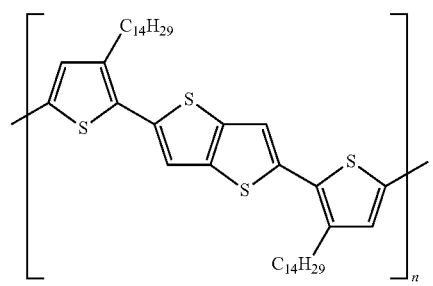

Suitably, the nanoparticles have a particle size of less than 300 nm and more suitably less than 250 nm.

In an embodiment, the size of the nanoparticles is within the range of 30 to 400 nm.

In another embodiment, the size of the nanoparticles is within the range of 30 to 300 nm.

In a further embodiment, the size of the nanoparticles is within the range of 50 to 250 nm.

In another embodiment, the size of the nanoparticles is within the range of 100 to 250 nm.

Preparation of the Nanoparticles of the Invention

The present invention further provides a method of forming nanoparticles as defined herein, said method comprising:
(i) forming the nanoparticles by emulsion polymerisation or miniemulsion polymerisation techniques to form a suspension of nanoparticles;
(ii) optionally purifying the nanoparticle suspension to remove one or more reaction by-products; and/or (iii) optionally isolating the nanoparticles.

In an embodiment, the nanoparticles are formed by the Stille polymerisation reaction.

The reaction is suitably carried out as an emulsion or miniemulsion polymerisation reaction.

A person skilled in the art will be able to select suitable reaction conditions for Stille polymerisation reactions, including the reaction time, reaction temperature etc.

In an alternative embodiment, the nanoparticles are prepared by Suzuki coupling reactions.

Organic Semi-conductor Devices and Components

In a further aspect, the present invention provides a process for preparing an organic semi-conductor device or component, said method comprising:
(i) depositing an aqueous composition comprising nanoparticles as defined herein onto a substrate; and
(ii) heating the substrate to a temperature above the glass transition temperature (Tg) of the nanoparticles to form a film of organic semi-conductive polymer on the substrate surface.

The process of the present invention provides device and components having good organic semi-conductor properties. Furthermore, the process involves the use of an aqueous composition rather than the harsh halogenated solvents that are conventionally used.

The processes of the present invention also allow the solutions to be applied at lower temperatures (or even at ambient temperature) instead of conventional techniques whereby temperatures in excess of 100° C. may be required throughout the process.

In addition, by applying the organic semi-conductor polymer in the form of nanoparticles, the process of the present invention enables films to be formed from polymers that are poorly soluble in the solvents conventionally utilised.

The above benefits represent major processing advantages.

In a further aspect, the present invention provides an organic semi-conductive film obtainable by, obtained by or directly obtained by the process defined herein.

In a further aspect, the present invention provides the use of an aqueous composition or nanoparticles as defined for the preparation of an organic semi-conductor film.

In a further aspect, the present invention provides the use of an aqueous composition or nanoparticles as defined for the preparation of an organic semi-conductor device or component.

In a further aspect, the present invention provides an organic semi-conductor film, device or component obtainable by, obtained by or directly obtained by a process as defined herein.

In a further aspect, the present invention provides an organic semi-conductor device or component comprising an organic semi-conductive film as defined herein.

The organic semi-conductor component or device may be any suitable component or device known in the art. For example, the component or device may be an optical or electro-optical component or device. Examples of suitable components or devices include an organic field effect transistor (OFET), thin film transistor (TFT), component of integrated circuitry (IC), radio frequency identification (RFD) tags, organic light emitting diodes (OLED), electroluminescence display, flat panel display, backlight, photodetector, sensor, logic circuit, memory element, capacitor, photovoltaic (PV) cell, photoconductor, and electrophotographic element.

In step (ii) of the process, the substrate is typically heated to a temperature in excess of 100° C.

For the preparation of photovoltaic devices in particular, the nanoparticles of the present invention may be mixed with an electron acceptor (e.g. n-type semiconductor, Buckminsterfullerenes i.e $C_{60}$, $C_{70}$, PCBM) or the nanoparticles are prepared in the presence of an electron acceptor.

An example of how to fabricate a semi-conductor device is described in the example section.

BRIEF DESCRIPTION OF THE DRAWINGS

The invention is described further in reference to the accompanying Figures in which.

EXAMPLES

Example 1

Preparation of conjugated nanoparticles of Poly(2,5-bis(3-tetradecylthiophen-2-yl)thieno[3,2-b]thiophene) (PBTTT) and Poly(3,6-Di(2-thien-5-yl)-2,5-di(2-octyldodecyl)-pyrrolo[3,4-c]pyrrole-1,4-dione) thieno[3,2-b]thiophene (PDPPTT)

Poly(2,5-bis(3-tetradecylthiophen-2-yl)thieno[3,2-b]thiophene) (PBTTT)[1] and Poly(3,6-Di(2-thien-5-yl)-2,5-di(2-octyldodecyl)-pyrrolo[3,4-c]pyrrole-1,4-dione)thieno[3,2-b]thiophene (PDPPTT)[2] both possess high hole-carrier mobilities as semi-conducting layer in Organic Field Effect Transistors (OFETs).

The structures of PBTTT and PDPPTT are shown below:

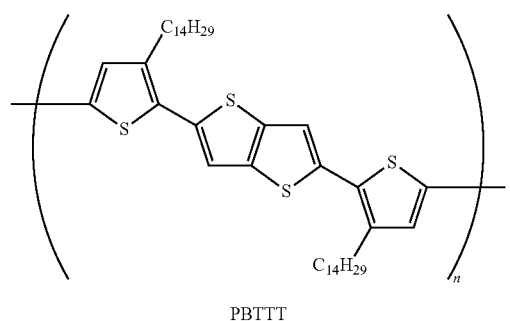

PBTTT

-continued

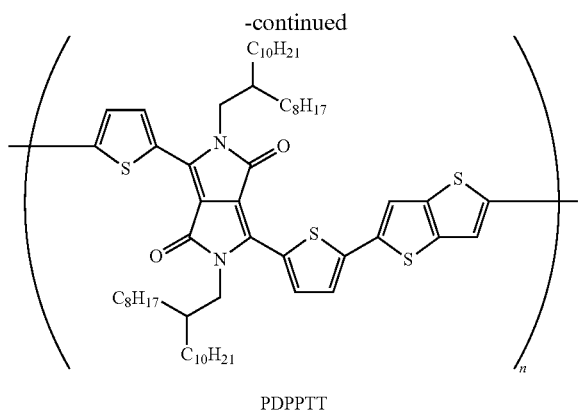

PDPPTT

In this example, polymers were synthesised by a technique of miniemulsion polymerization made in two steps:
1. Formation of monomers/catalyst minidroplets by injection of the organic solution in an emulsifier solution in water.
2. Polymerisation in the miniemulsion by Stille cross-coupling reaction between 2,5-bistrimethylstannyl-thieno[3,2-b]thiophene and 5,5'-dibromo-4,4'-ditetradecyl-2,2'-bithiophene (for PBTTT) or 3,6-Di(2-bromothien-5-yl)-2,5-di(2-octyldodecyl)-pyrrolo[3,4-c]pyrrole-1,4-dione (for PDPPTT).

Figure 1:
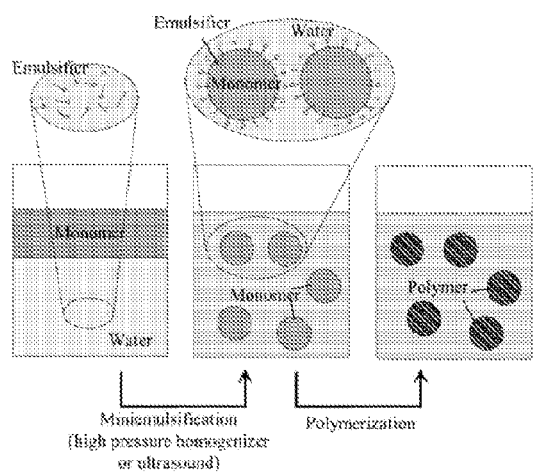
FIG. 1 shows a schematic representation of the miniemulsion polymerisation process.

The process is shown schematically in FIG. 1.

Experimental

Synthesis of 3-tetradecylthiophene

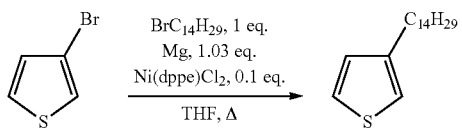

A dry 100 mL three neck round bottom flask equipped with a reflux condenser was flushed with argon and charged with magnesium (1.23 g, 51 mmol), one crystal of $I_2$, and 60 mL of anhydrous THF. To this solution, 1-bromotetradecane (14.6 mL, 49 mmol) was added dropwise under stirring. The reaction mixture was gently refluxed for 1 h under a nitrogen atmosphere. In a separate flask, 3-bromothiophene (4.6 mL, 49 mmol) and Ni(dppe)Cl$_2$ (155 mg, 0.29 mmol) were dissolved in 30 mL of anhydrous diethyl ether. The solution of 1-magnesiobromotetradecane was cannulated to the flask containing the 3-bromothiophene and the Ni(dppe)Cl$_2$ catalyst. The reaction was gently refluxed overnight under a nitrogen atmosphere. The reaction mixture was quenched by pouring into a beaker containing ice and HCl. The organic phase was washed with brine and water three times and was extracted with diethyl ether. The ether phase was dried over MgSO4, filtered and the solvent removed. 3-tetradecylthiophene was purified by column chromatography (silica gel, pentane). 1H NMR (CDCl$_3$, 400 MHz): δ 7.22-7.20 (m, 1H), 6.91-6.88 (m, 2H), 2.60-2.58 (t, J=7.6 Hz, 2H), 1.64 (m, 2H), 1.32-1.25 (m, 22H), 0.89-0.87 (t, J=6.6 Hz, 3H). $^{13}$C NMR (CDCl$_3$, 75 MHz,) δ 143.5, 138.4, 125.2, 119.3, 34.3, 32.1, 30.7, 30.4, 29.8, 29.8, 29.8, 29.6, 29.5, 29.5, 29.3, 22.9, 22.5, 14.3.

Synthesis of 2-bromo-3-tetradecylthiophene

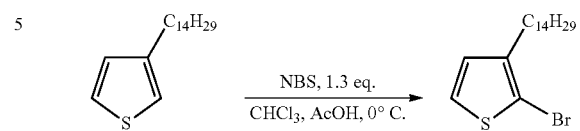

The compound 3-tetradecylthiophene (3 g, 11 mmol) was dissolved in a mixture of CHCl$_3$ and acetic acid (5 mL/5 mL) at 0° C. NBS (2.47 g, 14 mmol) was added portionwise and stirred for 20 min at 0° C. The solution was washed with water (2×50 mL), saturated NaHCO$_3$ (1×50 mL), and a final wash with water (1×50 mL). The organic layer was dried with anhydrous MgSO$_4$, concentrated, and purified by column chromatography (silica gel, pentane) to recover 2-bromo-3-tetradecylthiophene as a colourless oil (1.6 g, 42% yield). $^1$H NMR (CDCl$_3$, 400 MHz): δ 6.90 (d, J=7.6 Hz, 1H), 6.81 (d, J=7.6 Hz, 1H), 2.60-2.50 (t, J=7.6 Hz, 2H), 1.65-1.50 (m, 2H,), 1.40-1.15 (m, 22H), 0.91-0.81 (t, J=6.6 Hz, 3H). $^{13}$C NMR (CDCl$_3$, 75 MHz,) δ 142.1, 128.4, 125.3, 108.9, 53.9, 32.1, 29.9, 29.9, 29.8, 29.8, 29.7, 29.6, 29.5, 29.5, 29.4, 22.9, 22.9, 14.3.

Synthesis of 5,5'-dibromo-4,4'-ditetradecyl-2,2'-bithiophene

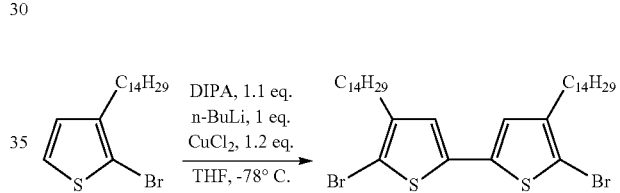

Diisopropylamine (465 mg, 4.6 mmol) was added to 30 mL of THF and the solution was cooled to 0° C. A 1.6 M n-Buli solution (2.6 mL, 4.2 mmol) was added dropwise during 30 minutes. The resulting mixture was stirred at 0° C. for another 30 min before cooling to −78° C. and subsequent dropwise addition of a solution of 2-bromo-3-tetradecylthiophene (1.5 g, 4.2 mmol) in 5 mL dry THF. The reaction mixture was stirred 60 min at −78° C., before dried copper (II)chloride (0.46 g, 5 mmol) was added in one portion. The reaction mixture was kept at −78° C. for 30 min in which the color of the reaction mixture changed from clear green/turquoise to clear blue to clear purple to clear brown to turbid brown. The cooling was removed and the reaction mixture was allowed to warm up to room temperature overnight. The reaction mixture was worked up by acidification of the reaction mixture with dilute hydrochloric acid to neutral pH followed by extraction with ether (3×50 mL), washing the combined ether layers with water (2×50 mL) followed by drying of the ether layer over MgSO$_4$. The solvent was removed under reduced pressure and the resulting brown oil was purified using column chromatography (silica gel, hexane) to give a crude product. The crude product was dissolved in a small amount of chloroform and precipitated in methanol cooled to 0° C., dried under vacuum at RT and finally recrystallized from ethyl acetate to give 2.42 g (3.4 mmol, 81%) of product as fluffy bright yellow crystals. $^1$H NMR (CDCl$_3$, 300 MHz) δ 6.79 (s, 2H), 2.55 (t, J=7.6 Hz, 4H), 1.57 (quint, 4H), 1.28 (m, 44H), 0.88 (t, J=7.6 Hz, 6H). $^{13}$C NMR (CDCl$_3$, 75 MHz,) δ 143.0, 136.2, 124.5, 107.9, 53.4, 32.0, 29.7, 29.7, 29.7, 29.7, 29.6, 29.6, 29.4, 29.4, 29.2, 22.7, 22.7, 14.2; HRMS (MALDI): m/z calcd for $C_{30}H_{60}Br_2S_2$: 716.25 (100%), 718.25 (54.3%); 714.25 (49.0%) [M]+; found: 716, 718, 714; elemental analysis calcd (%) for $C_{36}H_{60}Br_2S_2$: C, 60.32; H, 8.44; Br, 22.29; S, 8.95. found C, 60.25; H, 8.48; Br, 22.36; S, 8.84.

Synthesis of 9-(iodomethyl)nonadecane

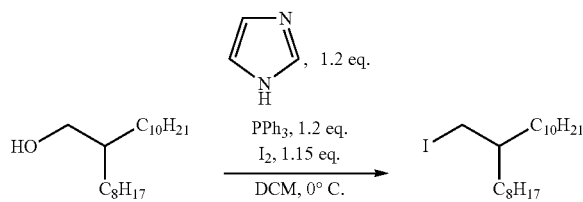

To a stirred solution of 2-octyl-dodecanol (14.8 mL, 42 mmol) in 40 mL of dichloromethane at 0° C. was added triphenylphosphine (11.9 mL, 50 mmol) and imidazole (2.8 mL, 50 mmol). The mixture was stirred for 15 minutes before iodine (12.1 g, 48 mmol) was added. The reaction was allowed to warm to room temperature over 2 h before the addition of 5 mL of saturated $Na_2SO_3$. The bright yellow reaction mixture was concentrated in vacuo, diluted with pentane (50 mL) and washed three times with water (100 mL) and once with brine (100 mL). The resulting pentane solution was passed through a 3 cm plug and concentrated in vacuo to yield the product as a colourless oil (16.6 g, 98%). NMR (CDCl$_3$, 400 MHz): δ 3.28 (d, J=4.5 Hz, 2H), 1.11-1.34 (m, 33H), 0.85-0.94 (m, 6H). $^{13}$C NMR (CDCl$_3$, 75 MHz,) δ 38.8, 34.6, 32.1, 32.0, 29.9, 29.8, 29.7, 29.5, 28.9, 22.9, 22.8, 17.1, 14.3.

Synthesis of 3,6-Dithiophen-2-yl-2,5-dihydro-pyrrolo[3,4-c]pyrrole-1,4-dione

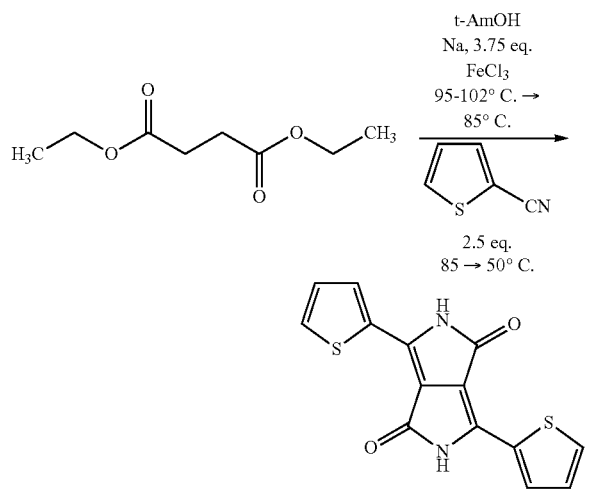

Sodium (3.16 g, 137 mmol), t-amyl alcohol (45 mL) and iron(III)chloride (50 mg) were added into a flask. The mixture was warmed up to 95-102° C. for 1 h until the sodium disappeared, and then cooled to 85° C. 2-Thiophenecarbonitrile (8.53 mL, 92 mmol) was injected in one portion. Diethyl succinate (6.09 mL, 37 mmol) in 5 mL of t-amyl alcohol was dropped slowly in 15 min. The mixture was kept at 85° C. for 2 h and was then cooled to 50° C. The mixture was then diluted with methanol (25 mL). Glacial acetic acid (15 mL) was added slowly and the mixture was refluxed for 2 min. The mixture was cooled to 50° C. again and was diluted with methanol (25 mL). The suspension was filtered. The solid product was washed with hot water and methanol, and was dried under vacuum at the temperature of 60° C. to get a deep red solid (6 g, 55%). The product was used for next step without further purification. $^1$H NMR (DMSO-D$_6$), 400 MHz): δ 11.26 (s, 2H), 8.21 (d, J=3.7 Hz, 2H), 7.96 (d, J=4.9 Hz, 2H), 7.30 (dd, J$_1$=3.7 Hz, J$_2$=4.9 Hz, 2H). $^{13}$C NMR (CDCl$_3$, 75 MHz,) δ 161.8, 136.2, 132.7, 131.3, 130.9, 128.8, 108.9.

Synthesis of 2,5-bis(2-octyldodecyl)-3,6-di(thiophen-2-yl)-2,5-dihydropyrrolo[3,4-c]pyrrole-1,4-dione

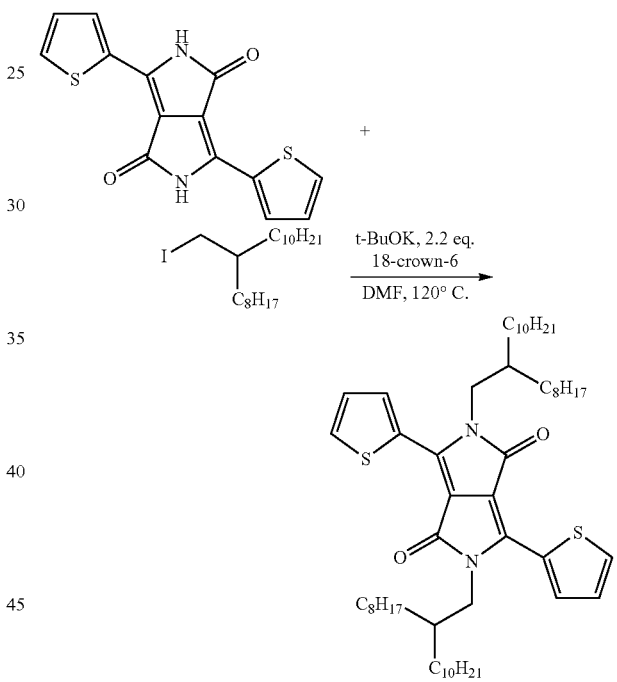

Anhydrous potassium tert-butoxide (1.15 g, 10 mmol) and 3,6-Dithiophen-2-yl-2,5-dihydro-pyrrolo[3,4-c]pyrrole-1,4-dione (1.4 g, 5 mmol) were dissolved in N,N-dimethylformamide (DMF, 40 mL) and were heated to 120° C. under argon for 1 h. 9-(iodomethyl)nonadecane (11.42 g, 28 mmol) was added dropwise and the mixture was heated overnight at 130° C. The solution was cooled to room temperature. It was poured into water (200 mL) and was extracted with dichloromethane. The organic layer was collected and dried with anhydrous MgSO$_4$. Solvent was removed under reduced pressure and residue was purified by flash chromatography on silica gel dichloromethane/petroleum ether (1:5) as eluent to give the titled compound (1 g, 25%). $^1$H NMR (CDCl$_3$, 400 MHz): δ 8.87 (d, J=4.0 Hz, 2H), 7.62 (d, J=4.8 Hz, 2H), 7.27 (m, 2H), 4.02 (d, J=8.0 Hz, 4H), 1.90 (s, 2H), 1.18-1.34 (m, 32H), 0.85 (m, 12H). $^{13}$C (CDCl$_3$, 100 MHz): δ 161.9, 140.6, 135.4, 130.8, 130.0, 128.5, 108.1, 46.3, 37.9, 32.1, 32.0, 30.2, 30.2, 29.8, 29.8, 22.8, 22.8, 14.3, 14.3. HRMS (MALDI): m/z calcd for $C_{54}H_{88}N_2O_2S_2$: 860.63 (100%), 861.63 (61.8%), 862.64 (17.4%); [M]+; found: 860, 861, 862, 863, 864.

Synthesis of 3,6-Di(2-bromothien-5-yl)-2,5-di(2-octyldodecyl)-pyrrolo[3,4-c]pyrrole-1,4-dione

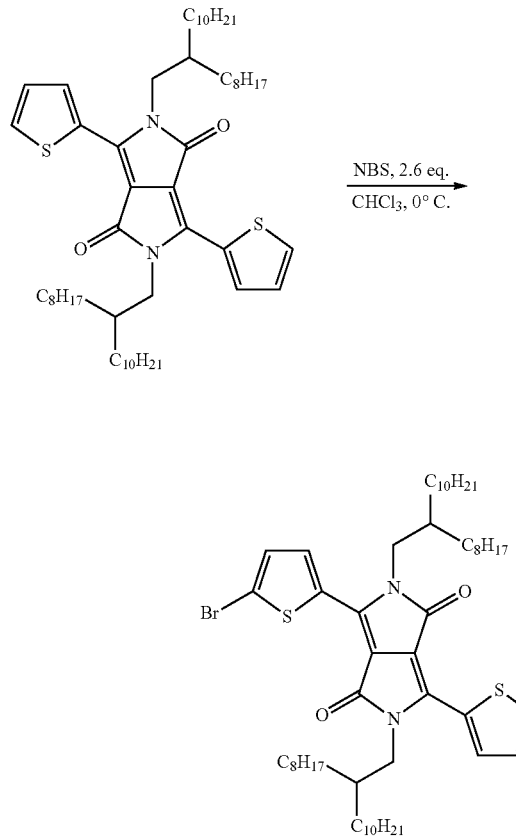

2,5-bis(2-octyldodecyl)-3,6-di(thiophen-2-yl)-2,5-dihydropyrrolo[3,4-c]pyrrole-1,4-dione (400 mg, 0.46 mmol) was dissolved in anhydrous chloroform (20 mL) in a Schlenk flask under argon wrapped with aluminum foil. N-Bromosuccinimide (215 mg, 1.21 mmol) was added in portions and the mixture was stirred at room temperature under argon overnight. The reaction mixture was then poured into ice water (250 mL) and extracted with dichloromethane. The organic layers were collected and dried with anhydrous $MgSO_4$. Solvent was removed under reduced pressure and residue was purified by flash chromatography on silica gel with diethyl ether/hexane (1:30) as eluent. The compound was then suspended in methanol, filtered and the remaining crystals were washed with hot water, cold methanol and dried under vacuum to obtain a dark red solid (450 mg, 95%). $^1$H NMR (CDCl$_3$, 400 MHz): δ 8.62 (d, J=4 Hz, 2H), 7.21 (d, J=4.4 Hz, 2H), 3.92 (d, J=8.0 Hz, 4H), 1.85 (s, 2H), 1.18-1.30 (m, 32H), 0.86 (m, 12H). $^{13}$C (CDCl$_3$, 100 MHz): δ 161.6, 139.6, 135.6, 131.6, 131.4, 119.2, 108.2, 46.5, 38.0, 32.2, 32.1, 31.4, 30.2, 30.0, 30.0, 29.8, 29.7, 29.6, 29.5, 26.4, 22.9, 22.9, 14.4. HRMS (MALDI): m/z calcd for $C_{54}H_{86}Br_2N_2O_2S_2$: 1018.45 (100%), 1020.45 (64.4%); [M]+; found: 1016, 1017, 1018, 1019, 1020.

Synthesis of 2,5-Bistrimethylstannyl-thieno[3,2-b]thiophene

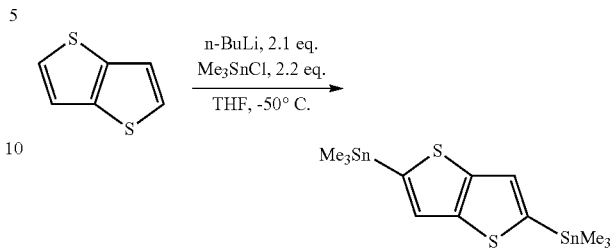

Thieno[3,2-b]thiophene (1.11 g, 7.9 mmol) are dissolved in 20 ml anhydrous THF under argon and cooled to −50° C. 10 mL (16.6 mmol) of a 1.6M n-butyllithium solution in hexane are added dropwise for 45 minutes. The mixture is stirred for 2 hours at −50° C., then trimethyltin chloride (3.47 g, 17.4 mmol) in 18 mL of anhydrous THF is added. The solution is stirred at −50° C. for 2 h, then warmed up to room temperature, and stirred overnight at this temperature. The solution is diluted with 100 ml diethylether, extracted with aqueous sodium bicarbonate solution, dried and evaporated. The residue is crystallized from acetonitrile at −20° C. to yield 1.9 g (58%) of colourless crystals. $^1$H NMR (CD$_2$Cl$_2$, 300 MHz,): δ 7.28 (s, 2H), 0.41 (s, 2H); $^{13}$C NMR (CDCl$_3$, 75 MHz,): δ 147.6, 141.4, 126.1, −8.1.

1A Emulsion Polymerization of PBTTT Nanoparticles

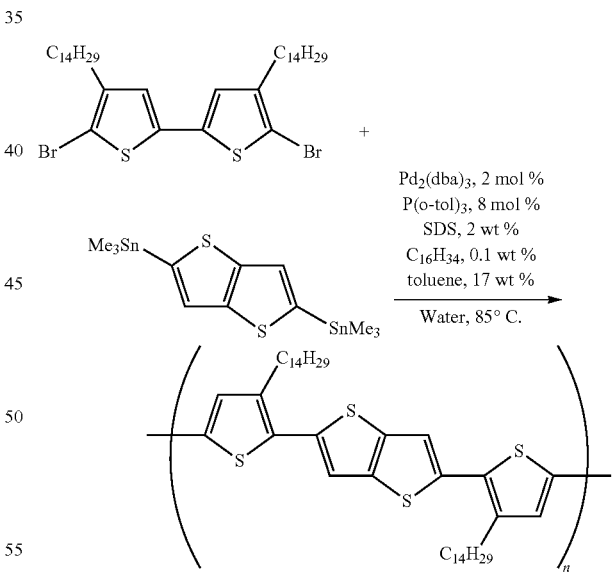

Hexadecane (0.03 mL) was added to an aqueous solution (16 mL) of an ionic surfactant, sodium dodecyl sulfate (410 mg, 2 wt % in de-ionized water) in a Schlenk tube. The contents were then degassed at room temperature by carefully evacuating/refilling the Schlenk tube with argon (3 times) and then by bubbling argon through the stirred solution for 30 minutes. 5,5'-dibromo-4,4'-ditetradecyl-2,2'-bithiophene (200 mg, 279 µmol), 2,5-Bistrimethylstannyl-thieno[3,2-b]thiophene (130 mg, 279 µmol), Pd$_2$(dba)$_3$ (5 mg, 5.6 µmol) and P(o-tol)$_3$ (7 mg, 22.3 µmol) are added in a separate 25 mL Schlenk tube inside a glove box with an argon atmosphere and then dissolved in 4 mL of toluene. The monomer/catalyst solution was then degassed by bubbling argon through the stirred solution for 10 minutes. The monomers/catalyst mixture was finally added into the stirred surfactant solution and the resulting mixture was stirred for 10 minutes for preemulsification. The miniemulsion was prepared by ultrasonicating the mixture for 10 min. The mixture was then heated up to 85° C. This temperature was maintained at a stirring speed of 700 rpm under an argon atmosphere for 24 h. The nanoparticles suspension is then dialysed via dialysis membrane tubing immersed in 2 L of de-ionized water for 5 days (the water is replaced every day in order to be rid of the maximum of surfactant). The suspension is afterward poured in a beaker and a mixture of SiliaMetS® Thiourea (5 mg, loading 1.08 mmol/g) and SiliaMetS® TAAcONa (1188 mg, loading 0.47 mmol/g). The amounts of metal to be scavenged and metal scavenger to use are calculated according to the following formula proposed by the Silicycle® Company:

$$\text{amount of metal in } m\text{mol} = \frac{Qty \text{ of catalyst used for the reaction} \times 1000}{\text{metal catalyst molecular weight}}$$

$$\text{amount of } SiliaMetS \text{ to use} = \frac{\text{amount of metal in } m\text{mol}}{SiliaMetS \text{ loading}}$$

The mixture is stirred at room temperature for 24 h and then filtered through cotton to afford the suspension ready to be used for the deposition on a SiO$_2$/Si substrate. GPC (CH$_5$Cl) Mn (16428 g/mol), Mw (31458 g/mol).

1B Emulsion Polymerization of PDPPTT Nanoparticles

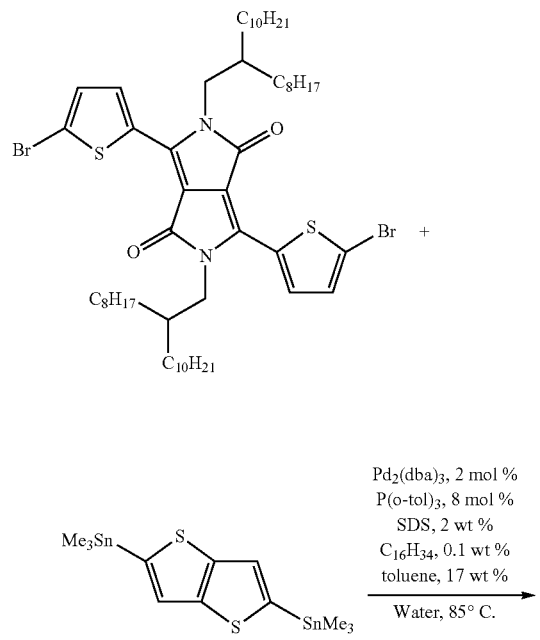

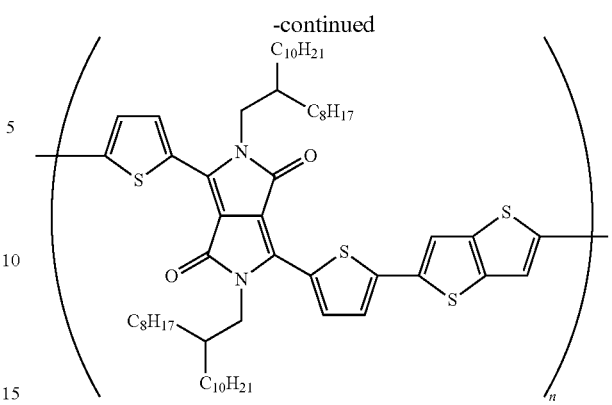

Hexadecane (0.05 mL) was added to an aqueous solution (25 mL) of an ionic surfactant, sodium dodecyl sulfate (625 mg, 2 wt % in de-ionized water) in a Schlenk tube. The contents were then degassed at room temperature by carefully evacuating/refilling the Schlenk tube with argon (3 times) and then by bubbling argon through the stirred solution for 30 minutes. 3,6-Di(2-bromothien-5-yl)-2,5-di (2-octyldodecyl)-pyrrolo[3,4-c]pyrrole-1,4-dione (100 mg, 98 µmol), 2,5-Bistrimethylstannyl-thieno[3,2-b]thiophene (46 mg, 98 µmol), Pd$_2$(dba)$_3$ (1.8 mg, 1.96 µmol) and P(o-tol)$_3$ (2.4 mg, 7.85 µmol) are added in a separate 25 mL Schlenk tube inside a glove box with an argon atmosphere and then dissolved in 2 mL of toluene. The monomer/catalyst solution was then degassed by bubbling argon through the stirred solution for 10 minutes. The monomers/catalyst mixture was finally added into the stirred surfactant solution and the resulting mixture was stirred for 10 minutes for preemulsification. The miniemulsion was prepared by ultrasonicating the mixture for 10 min. The mixture was then heated up to 85° C. This temperature was maintained at a stirring speed of 700 rpm under an argon atmosphere for 24 h. The nanoparticles suspension is then dialysed via dialysis membrane tubing immersed in 2 L of de-ionized water for 5 days (the water is replaced every day in order to be rid of the maximum of surfactant). The suspension is afterward poured in a beaker and a mixture of SiliaMetS® Thiourea (2 mg, loading 1.08 mmol/g) and SiliaMetS® TAAcONa (418 mg, loading 0.47 mmol/g). The mixture is stirred at room temperature for 24 h and then filtered through cotton. GPC (CH$_5$Cl) Mn (13422 g/mol), Mw (178131 g/mol).

1C Emulsion Polymerization of PDPPTT Nanoparticles (10 mg/mL)

Hexadecane (0.01 mL) was added to an aqueous solution (13 mL) of an ionic surfactant, sodium dodecyl sulfate (333 mg, 2 wt % in de-ionized water) in a Schlenk tube. The contents were then degassed at room temperature by carefully evacuating/refilling the Schlenk tube with argon (3 times) and then by bubbling argon through the stirred solution for 30 minutes. 3,6-Di(2-bromothien-5-yl)-2,5-di (2-octyldodecyl)-pyrrolo[3,4-c]pyrrole-1,4-dione (80 mg, 78 µmol), 2,5-Bistrimethylstannyl-thieno[3,2-b]thiophene (37 mg, 78 µmol), Pd$_2$(dba)$_3$ (1.4 mg, 1.57 µmol) and P(o-tol)$_3$ (1.91 mg, 6.28 µmol) are added in a separate 25 mL Schlenk tube inside a glove box with an argon atmosphere and then dissolved in 3.2 mL of chlorobenzene. The monomer/catalyst solution was then degassed by bubbling argon through the stirred solution for 10 minutes. The monomers/catalyst mixture was finally added into the stirred surfactant solution and the resulting mixture was stirred for 10 minutes for preemulsification. The miniemulsion was prepared by ultrasonicating the mixture for 10 min. The mixture was then heated up to 85° C. This temperature was maintained at a stirring speed of 700 rpm under an argon atmosphere for 24 h. The nanoparticles are extracted by centrifugation (14000 rpm for 30 min) of 0.1 mL of the reaction mixture in a 1.5 mL eppendorf (supplemented with 1.4 mL de-ionized water). The particles are washed by re-suspending them in de-ionized water followed by centrifugation at 14000 rpm for 30 min (process is carried out three times). The particles are afterward re-suspended in de-ionized water (10 mg/mL) and poured in a beaker and a mixture of SiliaMetS® Thiourea (2 mg, loading 1.08 mmol/g) and SiliaMetS® TAAcONa (334 mg, loading 0.47 mmol/g). The mixture is stirred at room temperature for 24 h and then filtered through cotton.

Characterisation of Nanoparticles:

Size and Zeta-potential of Nanoparticles

Nanoparticle sample are prepared with withdrawing 1 mg of particles from the reaction mixture. Sample is washed with de-ionized water (overall volume of 1.5 mL). The water is removed after the centrifugation of the sample (14000 rpm for 20 min). This process is done three times. The size and zeta potential of the nanoparticle dispersions were measured using a Malvern Zetasizer, Nano ZS, at a temperature of 20° C.

The particle size of the PBTTT particles (1A) was 166 nm (PDI 0.078).

The particle size of the PDPPTT particles (1B) was 217 nm (PDI 0.272) and the size of the PDPPTT (10 mg/ml) particles (1C) was 149 nm (PDI 0.202).

Metal Scavenging

Palladium and tin wastes from Stille cross-coupling are removed by functionalized silica gel from the Silicycle® Company: SiliaMet-Thiourea (Pd) and SiliaMet-TAAcONa (Sn).

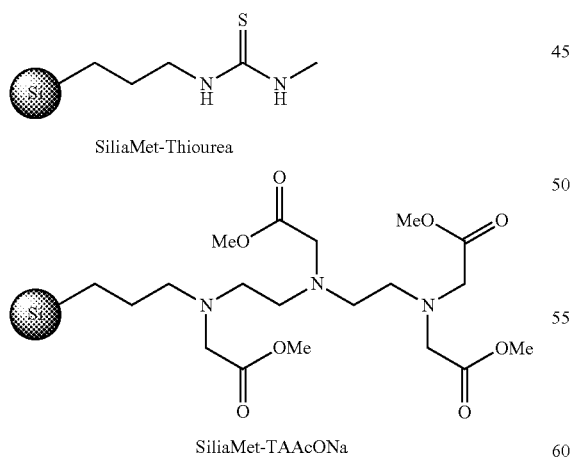

SiliaMet-Thiourea

SiliaMet-TAAcONa

Palladium and tin concentrations were checked by Inductively Coupled Plasma-Mass Spectrometer (ICP-MS). It shows for PBTTT particles infinitesimal amounts of metal (See table 1) which suggests that all metal seems to be removed.

TABLE 1

| Concentration of metal in PBTTT particles Quantity contained in the particles | |
|---|---|
| Before purification | After purification |
| 0.3% of Pd | 94 ppm of Pd |
| 19% of Sn | 20 ppm of Sn |

Example 2

Preparation of Conjugated Polymer Nanoparticles (CPN) in Emulsion Systems

A range of stable emulsions of conjugated polymer nanoparticles (CPN) were synthesized via Suzuki cross-coupling reactions of 9, 9-dioctylfluorene-2, 7-diboronic acid bis (1, 3-propanediol) ester (1) with each of the dibromo monomeric structures (2, 3, 4 or 5) presented in Scheme 1 below. In each case, the two monomers and palladium catalyst, (IPr*)PdCl$_2$(TEA) (2 mol %, structure 6) were dissolved in xylene and dispersed as an emulsion using the non-ionic surfactant, Triton X-102 (typically 5 wt % in water); the base used was tetraethylammonium hydroxide (1 equiv.).

All polymerisation reactions described were successfully catalysed in emulsion conditions with (IPr*)PdCl$_2$(TEA) at 30° C. after 24-48 hr.

Scheme 1.
Structures of monomers (1-5) and catalyst (6) used in Suzuki cross-coupling reactions to produce stable emulsions of conjugated polymer nanoparticles

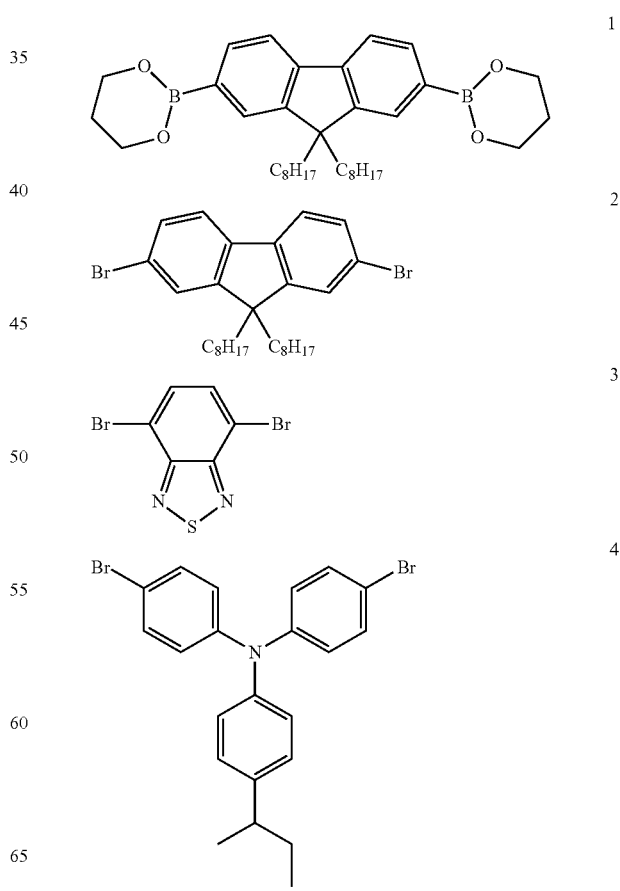

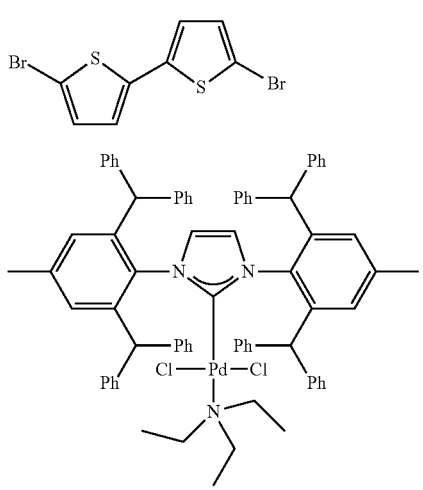

2.1. Syntheses of Poly(9,9-dioctylfluorene), PF8 [Poly(1-2)] emulsions

Typical Polymerization Reaction. The following procedure was used to produce a nanoparticulate PF8 dispersion, designated as reaction A in Table 2. Tetraethylammonium hydroxide solution (40% in water) (0.16 g, 0.4 mmol) was added to an aqueous solution (50 ml) of non-ionic surfactant, Triton X-102 (2.5 g, 5 wt % in de-ionised water) in a 100 ml three necked round bottom flask. The contents were then thoroughly degassed for 30 min by bubbling nitrogen gas through the solution, whilst being stirred using a D-shaped PTFE paddle powered by an overhead stirrer motor. Then a separate 10 ml two necked round bottom flask was used to mix together the monomers in the organic solvent prior to addition to the reaction flask: Monomer 1 (0.1151 g, 0.2 mmol) and monomer 2 (0.1096 g, 0.2 mmol) were dissolved in xylene (2 ml). The monomer solution was degassed and then the catalyst (IPr*)PdCl$_2$(TEA) (0.0095 g, 0.008 mmol) was added, followed by further degassing of the resultant solution. A syringe was used to transfer the monomer/catalyst solution into the stirring surfactant/base solution (300 rpm) in the main reaction flask now maintained at 30° C. The contents were mechanically stirred under nitrogen gas at 30° C. for 24 hours. The addition of the monomer/catalyst mixture causes the contents to become cloudy. After about one hour the reaction contents cleared as the nanoparticles formed and the colour of the dispersion progressively changed to pale yellow over the remaining reaction time.

A sample of the final crude emulsion (0.5 ml) was added to a centrifuge vial and supplemented with 1.0 ml of methanol. The vial contents were then centrifuged at 14,000 rpm for 10 min. Polymeric material sedimented out and the supernatant liquid was decanted by pipette. Water (0.5 ml) was added to re-disperse the sample material, then methanol (1.0 ml) and a further centrifuge cycle at 14,000 rpm for 10 min was completed. The supernatant was again decanted from the vial and the polymer was left to dry under vacuum. A small amount of THF (1.5 ml) was added to the sample vial to re-dissolve the polymer in preparation for gel permeation chromatography (GPC) analysis to determine the molar mass of polymer present. The uv-vis spectral features and DLS analysis reported were obtained from 8 μL of crude emulsion in 3 ml of water. The fluorescence measurement of the emulsion was obtained from excitation at λ=390 nm.

Higher concentrations of PF8 nanoparticles were achieved by increasing the monomer concentration in xylene and/or the amount of xylene and surfactant respectively as outlined in Reactions B, C and D in Table 2. The optical properties of the PF8 emulsions are outlined in Table 3.

TEM analysis of the PF8 nanoparticulate emulsions indicated that regular rod-like structures were formed using this synthetic method. Rods up to 100 nm in length with aspect ratios of 4-5 were observed.

2.2 Syntheses of Poly[(9,9-di-octylfluorenyl-2,7-diyl)-co-(benzo[2,1,3]thiadiazol-4,8-diyl)]PF8BT [Poly(1-3)] emulsions The method described in Section 2.1. was replicated with boronic ester 1 (0.1151 g, 0.2 mmol) and dibromo 3 (0.05800 g, 0.2 mmol) monomers to synthesis an emulsion containing PF8BT nanoparticles (reaction E in Table 2). A sample of the polymer produced in the emulsion reaction was isolated for molar mass analysis using the method previously described. Characterisation of the molar mass of the polymer produced and the emulsion formed are presented in Table 2. The uv-vis spectral features and DLS analysis reported were obtained from 27 μL of crude emulsion in 3 ml of water. The fluorescence measurement of the emulsion was obtained from excitation at λ=470 nm.

A higher concentration of PF8BT nanoparticles was obtained by increasing the concentration of monomer dissolved in the xylene at start of reaction (reaction F in Table 2). The optical properties of the PF8BT emulsions are outlined in Table 3.

TEM analysis of the PF8BT nanoparticulate emulsions indicated regular distributions of spherical nanoparticles with average particle size ($d_n$) of about 20 nm.

2.3. Syntheses of poly(9,9'-dioctylfluorene-co-bis-N,N'-(4-butylphenyl) diphenylamine), PF8TAA [Poly(1-4)] emulsions The method described in Section 2.1. was replicated with boronic ester 1 (0.1151 g, 0.2 mmol) and dibromo 4 (0.09180 g, 0.2 mmol) monomers to synthesis an emulsion containing PF8TAA nanoparticles (reaction G in Table 2). The reaction in this case was maintained at 30° C. for 48 hr. A sample of the polymer produced in the emulsion reaction was isolated for molar mass analysis using the method previously described. Characterisation of the molar mass of the polymer produced and the emulsion formed are presented in Table 2. The uv-vis spectral features and DLS analysis reported were obtained from 11 μL of crude emulsion in 3 ml of water. The fluorescence measurement of the emulsion was obtained from excitation at λ=380 nm.

A further emulsion reaction to produce higher concentration of PF8TAA [Poly(1-4)] nanoparticles was successfully completed starting from a fourfold increased concentration of monomers, xylene, surfactant and base. This equated to producing an emulsion which contained 9.5 mg/ml of conjugated polymeric material (reaction H in Table 2).

Tetraethylammonium hydroxide solution (40% in water) (0.6268 g, 1.6 mmol), was added to an aqueous solution (50 ml) of non-ionic surfactant, Triton X-102 (10 g, 20 wt % in de-ionised water) in a 100 ml three necked round bottom flask. The contents were then thoroughly degassed for 30 mins by bubbling nitrogen gas through the mechanically stirred solution. Then a separate 10 ml two necked round bottom flask was used to mix together the monomers in the organic solvent prior to addition to the reaction flask. Boronic ester 1 (0.4604 g, 0.8 mmol and dibromo 4 (0.3672 g, 0.8 mmol) were dissolved in xylene (8 ml). The monomer solution was degassed and then the catalyst (IPr*)PdCl$_2$ (TEA) (0.038 g, 0.032 mmol) was added, followed by further degassing of the resultant solution. A syringe was used to transfer the monomer/catalyst into the stirred surfactant/base solution (300 rpm) in the main reaction flask now maintained at 30° C. The contents were mechanically stirred under nitrogen gas at 30° C. for 48 hours.

A sample of the polymer produced in the emulsion reaction was isolated for molar mass analysis using the method previously described. Characterisation of the molar mass of the polymer produced and the emulsion formed are presented in Table 2. The uv-vis spectral features and DLS analysis reported were obtained from 12 µL of crude emulsion in 8.5 ml of water. The fluorescence measurement of the emulsion was obtained from excitation at λ=380 nm. The optical properties of the PF8TAA emulsions are outlined in Table 3.

TEM analysis of the PF8TAA nanoparticulate emulsions indicated regular distribution of spherical nanoparticles with average particle size ($d_n$) of between 20-40 nm.

2.4. Syntheses of Poly[(9,9-dioctylfluorenyl-2,7-diyl)-co-bithiophene], PF8T2 [Poly(1-5)] emulsions The method described in Section 2.1. was replicated with boronic ester 1 (0.1151 g, 0.2 mmol) and dibromo 5 (0.0648 g, 0.2 mmol) monomers to synthesis an emulsion containing PF8T2 nanoparticles (reaction I in Table 2A). A sample of the polymer produced in the emulsion reaction was isolated for molar mass analysis using the method previously described. Characterisation of the molar mass of the polymer produced and the emulsion formed are presented in Table 2A. The uv-vis spectral features and DLS analysis reported were obtained from 12 µL of crude emulsion in 3 ml of water. The fluorescence measurement of the emulsion was obtained from excitation at λ=460 nm.

A higher concentration of PF8T2 nanoparticles was successfully completed starting with a fourfold increase in amount of monomers and base in a twofold increase in xylene and surfactant. This equated to producing an emulsion which contained 8.2 mg/ml of conjugated polymeric material (reaction J in Table 2A). The optical properties of the PF8T2 nanoparticles are outlined in Table 2B.

TEM analysis of the PF8T2 nanoparticulate emulsions indicated that regular rod-like structures were formed using this synthetic method. Rods up to 200 nm in length with aspect ratios of 4-5 were observed.

TABLE 2A

Suzuki-Miyaura cross-coupling polymerizations of diboronic ester monomer (1) with dibromo monomers (2-5) under different emulsion conditions to produce PF8, PF8BT, PF8TAA and PF8T2[a]

| | Total Monomers, 1 + x | monomer/ mmol | Xylene y/ml | Triton X-102, z/wt % | Polymer conc.[b]/ mg ml$^{-1}$ | Molar mass[c]/kg mol$^{-1}$ | | Particle size/nm | |
|---|---|---|---|---|---|---|---|---|---|
| | | | | | | Mn | Mw | DLS[d] $d_z$ [PDI] | TEM[e] $d_n$, $l_n$, $w_n$ or $d_n$ |
| A | 2 | 0.4 | 2 | 5 | PF8, 3.0 | 27.2 | 87.5 | 53[0.33] | 21 76, 18 r |
| B | 2 | 0.8 | 2 | 5 | PF8, 6.0 | 28.9 | 95.4 | 55[0.41] | 26 74, 16 r |
| C | 2 | 1.2 | 4 | 10 | PF8, 8.6 | 6.1, 48.1[f] | 7.3, 83.5[f] | 81[0.32][f] | 22[f] 99, 23 r |
| D | 2 | 1.6 | 6 | 15 | PF8, 11.1 | 12.9 | 39.4 | 88[0.22] | 41 106, 25 r |
| E | 3 | 0.4 | 2 | 5 | PF8BT, 2.0 | 24.2 | 82.7 | 33[0.20] | 21 23 s |
| F | 3 | 0.8 | 2 | 5 | PF8BT, 4.0 | 26.0 | 67.1 | 34[0.16] | 23 22 s |
| G | 4 | 0.4 | 2 | 5 | PF8TAA, 2.6 | 18.5 | 49.8 | 41[0.33] | 18 19 s |
| H | 4 | 1.6 | 8 | 20 | PF8TAA, 9.5 | 9.2 | 21.7 | 56[0.22] | 33 41 s |
| I | 5 | 0.4 | 2 | 5 | PF8T2, 2.1 | 12.1 | 32.7 | 61[0.34] | 23 82, 18 r |
| J | 5 | 1.6 | 4 | 10 | PF8T2, 8.2 | 12.7 | 36.1 | 88[0.18] | 35 205, 52 r |

[a]Reaction conditions: equimolar quantities of monomers, 1 + x, dissolved in y ml xylene; 50 ml of z wt % Triton X-102 solution; 1 equivalent mmol of tetraethylammonium hydroxide; 2 mol % of (IPr*)PdCl$_2$(TEA) catalyst (6); 30° C.; typically 24 hr, 48 hr for reactions, G & H.

[b] Approx. conjugated polymer concentration of emulsion upon complete conversion.

[c]Determined by GPC in THF vs polystyrene standards.

[d]DLS analysis of the z-average and number average particle ($d_z$ and $d_n$) sizes of emulsion particles at 25° C.; polydispersity index (PDI) of particles presented.

Figure 2:
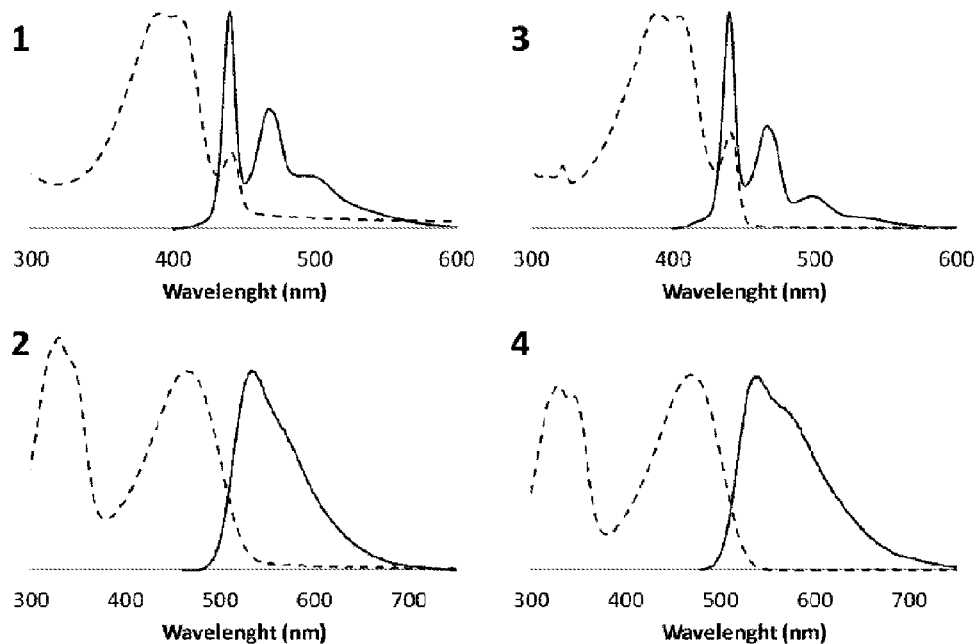
FIG. 2 shows the UV-vis absorption (dashed line) and PL emission spectra (solid line) of nanoparticles obtained by reactions 1-4 of Example 3; $\lambda_{ex}$=390 nm for reactions 1 and 3, $\lambda_{ex}$=450 nm for reactions 2 and 4.

[e]TEM analysis of the number average length ($l_n$) and number average width ($w_n$) dimensions or the number average particle ($d_n$) sizes of emulsion nanoparticles ($d_n$), denoted with s: predominantly spherical or r: predominantly rod-like in shape. Averages determined from the measurement of at least 100 nanoparticles in each case.

f Molar masses of resolved bimodal distribution of peaks observed in GPC trace of reaction C, presented in FIG. 2. Number average particle size ($d_n$) distribution was also bimodal for this emulsion.

TABLE 2B

Optical properties of conjugated polymer nanoparticulate dispersions.

| | Polymer conc.[a]/ mg ml$^{-1}$ | Polymer conc. in NP[b]/ mg ml$^{-1}$ | $\lambda_{abs}$[c]/ nm | $\lambda_{em}$[d]/ nm | $\Phi$[e]/% |
|---|---|---|---|---|---|
| A | PF8, 3.0 | 78 | 408, 442 | 441 | 21 |

TABLE 2B-continued

Optical properties of conjugated polymer nanoparticulate dispersions.

| | Polymer conc.[a]/ mg ml$^{-1}$ | Polymer conc. in NP[b]/ mg ml$^{-1}$ | $\lambda_{abs}$[c]/ nm | $\lambda_{em}$[d]/ nm | $\Phi$[e]/% |
|---|---|---|---|---|---|
| B | PF8, 6.0 | 155 | 409, 442 | 440 | 25 |
| C | PF8, 8.6 | 117 | 408, 441 | 440 | 22 |
| D | PF8, 11.1 | 104 | 407, 441 | 440 | 23 |
| E | PF8BT, 2.0 | 52 | 469 | 541 | 8.7 |
| F | PF8BT, 4.0 | 105 | 468 | 543 | 9.1 |
| G | PF8TAA, 2.6 | 69 | 387 | 434 | 3.4 |
| H | PF8TAA, 9.5 | 69 | 389 | 435 | 5.2 |
| I | PF8T2, 2.1 | 55 | 467 | 515, 557 | 2.8 |
| J | PF8T2, 8.2 | 111 | 503 | 518, 556 | 5.1 |

[a]Approx. conjugated polymer concentration of emulsion upon complete conversion.
[b]Conjugated polymer concentration in xylene in nanoparticles.
[c]$\lambda_{abs}$: wavelengths of absorption maxima of emulsions diluted in water.
[d]$\lambda_{em}$: wavelengths of emission maxima of emulsions diluted in water.
[e]Photoluminescence Quantum Yield ($\Phi$). Results are average of at least 3 measurements. Errors of 10% associated with the values.

Example 3

Preparation of nanoparticles of polyfluorene (PFO) and Poly(9,9'-dioctylfluorene-co-benzothiadiazole) (PF8BT)

General Miniemulson Procedure

Sodium dodecyl sulfate (SDS, 250 mg) and deionised water (25 mL) were transferred to a Schlenk tube and the resultant solution was degassed by bubbling with argon for 20 minutes. Monomers A and B (see table 3) were dissolved in toluene (1 mL), to which hexadecane (78 µL) was also added, and this solution was degassed for 5 minutes in the same manner. The catalyst (see table 3) was added to the monomer solution, which was then transferred to the reaction vessel. The reaction mixture was emulsified by ultra-sonication (Cole Parmer 750 W ultasonicator, with microtip, on 40% power) for 2 minutes while cooling with an ice bath. The Schlenk tube was resealed and the miniemulsion was heated to the reaction temperature (see table 3) and stirred for 16 hours. After cooling to room temperature, the cap of the reaction vessel was removed and the emulsion was stirred for 5 hours to remove the residual organic solvent. To remove residual SDS, the emulsion was transferred to dialysis tubing with a 25 KDa MWCO and dialysed against water for 7 days (changing with water twice daily).

TABLE 3

Amounts and conditions for miniemulsion polymerisation reactions

| Reaction | Polymer | Monomer A (amount) | Monomer B (amount) | Catalyst (amount) | Reaction temp. (° C.) |
|---|---|---|---|---|---|
| 1 | PFO | 9,9-dioctyl-2,7-dibromofluorene (50.0 mg, 91.2 µmol) | 2,7-di(boronic acid pinacol ester)-9,9-dioctyl-fluorene (58.6 mg, 91.2 µmol) | Pd(PPh$_3$)$_4$ (2.1 mg, 1.9 µmol) | 85 |
| 2 | F8BT | 4,7-dibromo-2,1,3-benzothiadiazole (26.8 mg, 91.2 µmol) | 2,7-di(boronic acid pinacol ester)-9,9-dioctyl-fluorene (58.6 mg, 91.2 µmol) | Pd(PPh$_3$)$_4$ (2.1 mg, 1.9 µmol) | 85 |
| 3 | PFO | 9,9-dioctyl-2,7-Dibromofluorene (50.0 mg, 91.2 µmol) | 9,9-Dioctylfluorene-2,7-diboronic acid bis(1,3-propanediol) ester (50.9 mg, 91.2 µmol) | iPr*PdTEA (2.3 mg, 1.9 µmol) | 40 |
| 4 | F8BT | 4,7-dibromo-2,1,3-benzothiadiazole (26.8 mg, 91.2 µmol) | 9,9-Dioctylfluorene-2,7-diboronic acid bis(1,3-propanediol) ester (50.9 mg, 91.2 µmol) | iPr*PdTEA (2.3 mg, 1.9 µmol) | 40 |

Dynamic Light Scattering (DLS) Analysis

To prepare the nanoparticles for DLS analysis, 100 µL of the aqueous dispersion was diluted with 900 µL of deionised water and the particle size was measured using a Malvern Zetasizer Nano ZS.

TABLE 4

DLS analysis of nanoparticle size

| Reaction | Polymer | D$_z$/nm (PdI) |
|---|---|---|
| 1 | PFO | 135 (0.20) |
| 2 | F8BT | 125 (0.22) |
| 3 | PFO | 76 (0.21) |
| 4 | F8BT | 65 (0.16) |

Gel Permeation Chromatography (GPC) Analysis

The linear polymer that comprised the nanoparticles of each sample was isolated by evaporating 250 µL of the aqueous dispersion to dryness and then dissolving the residue in THF (1.5 mL). The insoluble surfactant (SDS) was removed from this solution by filtration through a 0.45 µm filter. Gel permeation chromatography was carried out at 35° C. using a Viscotek GPCmax VE2001 solvent/sample module with 2×PL gel 10 µm Mixed-B and PL gel 500A columns, a Viscotek VE3580 RI detector and a VE 3240 UV/VIS 50 multichannel detector. The flow rate was 1 mL/min and the system was calibrated with low polydispersity polystyrene standards in the range of 200 to 180×104 g/mol from Agilent. The analysed samples contained n-dodecane as a flow marker.

TABLE 5

GPC analysis of polymer molecular weight within nanoparticles

| Reaction | Polymer | $M_n$ (KDa) | $M_w$ (KDa) | PdI | DP |
|---|---|---|---|---|---|
| 1 | PFO | 20.2 | 53.5 | 2.6 | 52 |
| 2 | F8BT | 10.3 | 25.3 | 2.5 | 20 |
| 3 | PFO | 5.8 | 16.0 | 2.8 | 15 |
| 4 | F8BT | 26.8 | 52.3 | 1.9 | 51 |

Photophysical Characterisation

For measurement of the UV-vis absorption and photoluminescence spectra, samples of the as-prepared nanoparticle dispersions were diluted with deionised water until the optical density at $\lambda_{abs}$ was <1. UV-Vis absorption spectra of the nanoparticles dispersions were recorded on a Varian Cary 55 5000UV-Vis-NIR spectrophotometer at room temperature. Fluorescence spectra of the same were recorded on a Varian Cary Eclipse fluorimeter in either THF (linear polymer) or water (nanoparticles) at room temperature.

The results are shown in FIG. 2.

Example 4

Synthesis of Green and Red-Emitting Conjugated Polymer Nanoparticles (CPNs) Based on PFO A series of conjugated polymer nanoparticles (CPNs) based on PFO with green (PFO-BT) and red emission (PFO-DBT) were synthesised by miniemulsion polymerisation via Suzuki coupling of 9,9-dioctyl-9H-fluorene-2,7-diboronic acid bis(pinacol) ester (A) with 9,9-dioctyl-2,7-dibromofluorene (B) and different loadings of 4,7-dibromo-2,1,3-benzothiadiazole (C) or 4,7-bis(2-bromo-5-thienyl)-2,1,3-benzothiadiazole (D) as acceptor units.

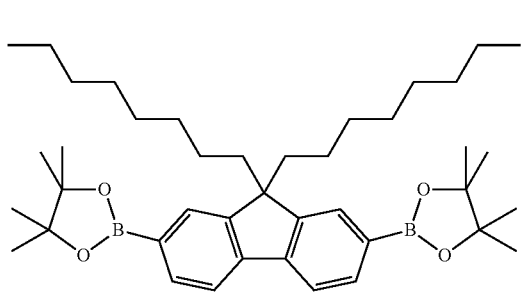
A

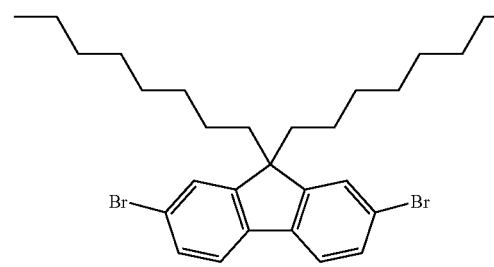
B

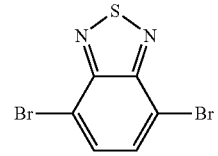
C

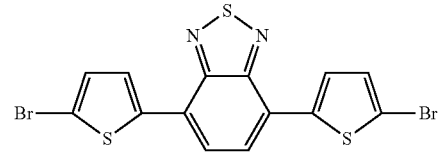
D

General Miniemulsion Procedure

In a Schlenk tube, sodium dodecyl sulfate (50 mg) was dissolved in deionised water (10 mL) under argon. The solution was degassed by bubbling with argon for 30 minutes. In a separate flask, monomer A (58.6 mg, 9.12×10$^{-2}$ mmol), monomer B and monomer C or D (amounts in table 6) were dissolved in toluene (1 mL), to which hexadecane was added (78 µL) and the mixture was degassed by bubbling with argon for 5 min. After this time, tetrakis(triphenylphosphine)palladium (0) (2.2 mg, 9.13×10$^{-3}$ mmol) was added to the monomer mixture which was then injected to the SDS solution. To promote the miniemulsion, the Schlenk tube was taken to an ice bath and the mixture was sonicated using an ultrasonicator fitted with microtip (Cole Parmer 750 W ultrasonicator, 22% amplitude) for 2 minutes. The tube was resealed and then heated up to 72° C. Once reached this temperature, an aqueous solution of sodium hydroxide 1M (365 µL) was added and the reaction mixture was stirred for 16 h. After cooling down to room temperature, the Schlenk tube was opened and the mixture was stirred for 5 h to remove the residual toluene. To remove SDS, 400 µL of the resulting miniemulsion was diluted with 1.6 mL of deionised water and Amberlite XAD-2 (20 mg) previously washed with water (2×2 mL) was added. The mixture was stirred for 2 hours at room temperature and the Amberlite XAD-2 was removed. Treatment with Amberlite XAD-2 was repeated until the mixture was shaken and no foam formation was longer observed.

TABLE 6

Amount of monomers used in synthesis of PFO-BT and PFO-DBT CPNs.

| Polymer | Acceptor unit loading (%) | Monomer B (mass, moles) | Monomer C (mass, moles) | Monomer D (mass, moles) |
|---|---|---|---|---|
| PFO-BT5 | 5 | 45 mg (8.21 × 10$^{-2}$ mmol) | 2.7 mg (9.12 × 10$^{-3}$ mmol) | — |
| PFO-BT10 | 10 | 40 mg (7.3 × 10$^{-2}$ mmol) | 5.4 mg (1.82 × 10$^{-2}$ mmol) | — |
| PFO-DBT5 | 5 | 45 mg (8.21 × 10$^{-2}$ mmol) | — | 4.2 mg (9.12 × 10$^{-3}$ mmol) |

TABLE 6-continued

Amount of monomers used in synthesis of PFO-BT and PFO-DBT CPNs.

| Polymer | Acceptor unit loading (%) | Monomer B (mass, moles) | Monomer C (mass, moles) | Monomer D (mass, moles) |
|---|---|---|---|---|
| PFO-DBT10 | 10 | 40 mg ($7.3 \times 10^{-2}$ mmol) | — | 8.4 mg ($1.82 \times 10^{-2}$ mmol) |

For the determination of particle size by DLS, 60 pt of each sample after removal of SDS were diluted with 1 mL of deionised water and the evaluation was carried out using a Malvern Zetasizer Nano ZS.

The molecular weight of the polymers obtained from miniemulsion was determined by gel permeation chromatography in THF. The polymers were isolated by adding 750 μL of the crude miniemulsion in a 1.5 mL Eppendorf tube and filling the tube with methanol. The samples were centrifuged at 14,000 rpm for 10 min and decanted. The resulting precipitate for each sample was dried and dissolved in THF (1 mL), then filtered through a 0.45 μm filter. After addition of n-dodecane as flow marker the GPC determination was carried out using a Viscotek GPCmax VE2001 solvent/sample module with 2×PL gel 10 μm Mixed-B and PL gel 500A columns, a Viscotek VE3580 RI detector and a VE 3240 UV/VIS 50 multichannel detector. The flow rate was 1 mL/min and the system was calibrated with low polydispersity polystyrene standards in the range of 200 to 180×104 g/mol from Agilent.

The molecular weight and particle size of PFO-BT and PFO-DBT nanoparticles are shown in table 7.

TABLE 7

Molecular weight and particle size of green and red-emitting CPNs based on PFO.

| Polymer | $M_n$ (KDa) | $M_w$ (KDa) | PDI | $d_z$ (nm) | PdI |
|---|---|---|---|---|---|
| PFO-BT5 | 12,600 | 36,300 | 2.9 | 98 | 0.175 |
| PFO-BT10 | 14,000 | 39,500 | 2.8 | 98 | 0.146 |
| PFO-DBT5 | 12,100 | 32,400 | 2.7 | 95 | 0.191 |
| PFO-DBT10 | 5,700 | 19,500 | 3.4 | 97 | 0.241 |

The UV-vis absorption spectra of the aqueous dispersion of the CPNs were recorded using a Varian Cary 55 5000UV-Vis-NIR spectrophotometer. Fluorescence spectra of the same samples were recorded on a Varian Cary Eclipse fluorimeter at room temperature at an excitation wavelength of λ=390 nm and at λ=405 nm for green and red-emitting CPNs, respectively. The fluorescence quantum yield (QY) was determined using an integration sphere fitted to a Fluorolog 3-22-iHR (Horiba) spectrofluorometer configured with double excitation and emission monochromators with a cooled R928P photomultiplier tube operated in photon-counting mode used as detector. The photophysical properties are exhibited in table 8.

TABLE 8

Photophysical properties of green and red-emitting CPNs based on PFO

| Polymer | Absorption $\lambda_{max}$ (nm) | Fluorescence $\lambda_{max}$ (nm) | QY (%) | QY (StD) |
|---|---|---|---|---|
| PFO-BT5 | 380 | 534 | 41.13 | 3.18 |
| PFO-BT10 | 379 | 534 | 55.87 | 0.95 |

TABLE 8-continued

Photophysical properties of green and red-emitting CPNs based on PFO

| Polymer | Absorption $\lambda_{max}$ (nm) | Fluorescence $\lambda_{max}$ (nm) | QY (%) | QY (StD) |
|---|---|---|---|---|
| PFO-DBT5 | 382 | 631 | 34.3 | 3.36 |
| PFO-DBT10 | 380 | 633 | 17.57 | 1.05 |

Example 5

Synthesis of Poly(3-hexylthiophene-2,5-diyl) (P3HT) nanoparticles

P3HT nanoparticles were synthesised from an A-B type monomer functionalised with Br and a MIDA boronate via Suzuki coupling using miniemulsion polymerisation.

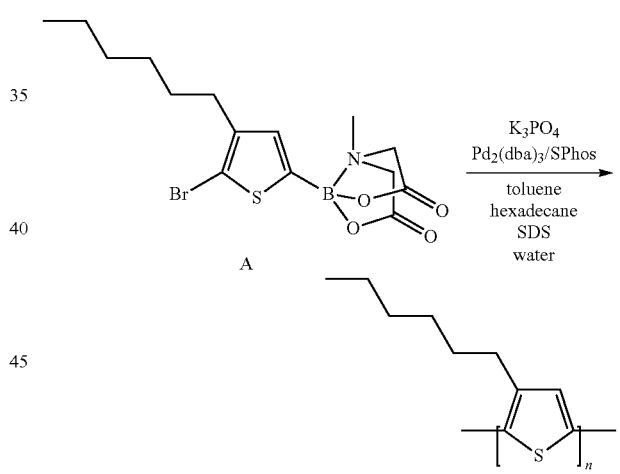

In a Schlenk tube, sodium dodecyl sulfate (50 mg) was dissolved in deionised water (10 mL) under argon. The solution was degassed by bubbling with argon for 30 minutes. In a separate Schlenk flask, monomer A (75 mg, 0.187 mmol) and hexadecane were added (78 μL). The flask containing the monomer was taken to the glovebox, then $Pd_2(dba)_3$ (4.3 mg, $4.65 \times 10^{-3}$ mol), SPhos (3.9 mg, $9.3 \times 10^{-3}$ mol) and 1 mL of degassed toluene were added. The resulting solution was further degassed by bubbling with argon for 10 min. After this time, the monomer mixture was injected to the SDS solution under stirring. To promote the miniemulsion, the Schlenk tube was taken to an ice bath and the mixture was sonicated using an ultrasonicator fitted with microtip (Cole Parmer 750 W ultrasonicator, 22% amplitude) for 2 minutes. The tube was resealed and then heated up at 55 or 72° C. Once reached the desired temperature, an aqueous solution of potassium phosphate 1M (375 μL) was added and the reaction mixture was stirred for 20 h. After cooling down to room temperature, the Schlenk tube was opened and the mixture was stirred for 5 h to remove the residual toluene.

For the determination of particle size by DLS, 60 μL of each crude sample were diluted with 1 mL of deionised water and the evaluation was carried out using a Malvern Zetasizer Nano ZS.

The molecular weight of the polymers obtained from miniemulsion was determined by gel permeation chromatography in THF as described in Example 4.

The UV-vis absorption spectra of the aqueous dispersion of the CPNs were recorded using a Varian Cary 55 5000UV-Vis-NIR spectrophotometer as mentioned in Example 4.

The molecular weight, particle size and absorption maximum of P3HT nanoparticles are shown in table 9.

TABLE 9

Characterisation of P3HT nanoparticles.

| Temperature (° C.) | Mn (KDa) | Mw (KDa) | PDI | dz (nm) | PdI | Absorption $\lambda_{max}$ (nm) |
|---|---|---|---|---|---|---|
| 55 | 4,000 | 9,100 | 2.2 | 106 | 0.269 | 507 |
| 72 | 4,200 | 9,500 | 2.3 | 97 | 0.280 | 494 |

Example 6

Figure 3:
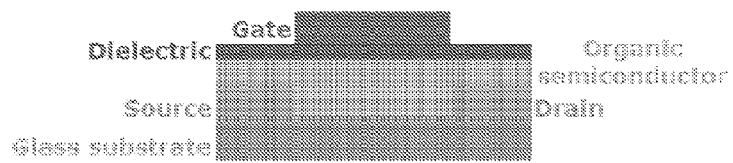
FIG. 3 shows a schematic view of the top-gate/bottom contact device on glass (see Example 4).

Fabrication and Characterisation of Devices Based on Nanoparticle and Linear PBTTT The schematic diagram of a top-gate/bottom contact OFET is shown in FIG. 3.

Figure 4:
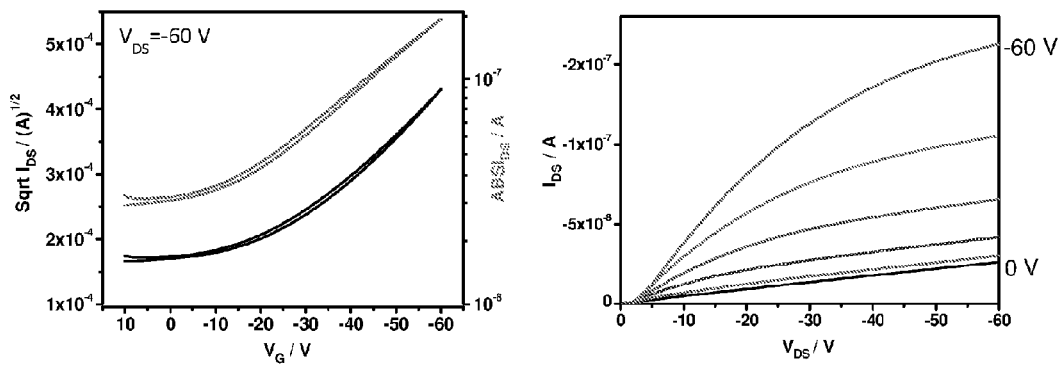
FIG. 4 shows an example transfer curve of the nanoparticle PBTTT top-gated/bottom contact transistor and the output characteristics of the same device (see Example 4)
Figure 5:
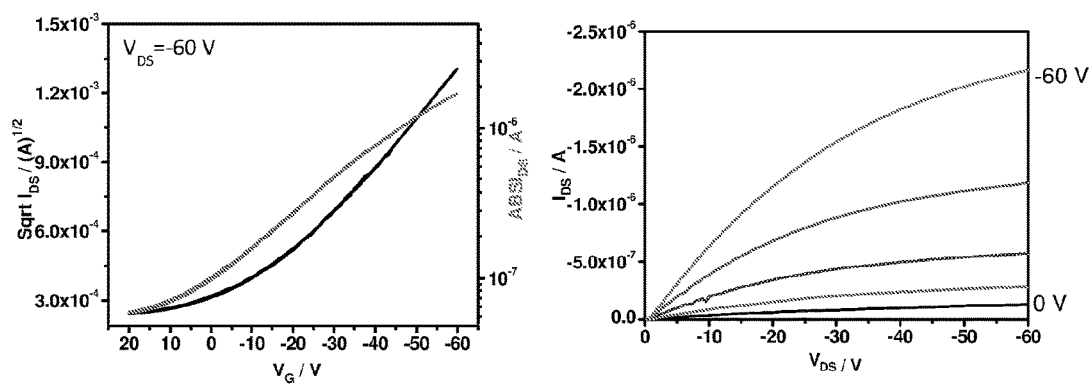
FIG. 5 shows a further example transfer curve of the linear PBTTT top-gated/bottom contact transistor and the output characteristics of the same device (see Example 4).

Top-gate/bottom contact devices were fabricated according to the following method. Glass substrates were cleaned by sequential rinsing with methanol, acetone and isopropanol, followed by drying under a flow of nitrogen. The glass substrates were then exposed to UV/ozone for 20 min. and oxygen plasma (60 W) for 2 min. 3 nm of Cr was thermally evaporated followed by evaporation of 40 nm of Au. Substrates were immersed for 24 h in ethanol solution of pentaflurobenzenethiol (PFBT) to form self-assembled monolayer (SAM) in which the molecules are chemisorbed to the gold by a thiolate link. The SAM-coated substrates were rinsed with solvent to remove physisorbed material before the nanoparticle PBTTT in water (10 mg/ml, ambient temperature) or linear PBTTT in 1,2-dichlorobenzene (7 mg/ml, heated to 100° C.) was spin-coated under ambient conditions or in the nitrogen glove box respectively, at 2000 rpm for 1 min. followed by annealing for 20 min. at 160° C. Next, poly(1,1,2,4,4,5,5,6,7,7-decafluoro-3-oxa-1,6-heptadiene), (200 μl, 9 wt % solution in perfluorotributylamine) was spin coated at 3000 rpm for 1 min. under ambient conditions. Substrates were then dried for 40 min. at 100° C. and Al top gate (70 nm) was thermally evaporated under high vacuum conditions (<$10^{-6}$ Torr) on the substrate through a shadow mask. In these devices the channel length L and the channel width W were 60 μm and 1 mm respectively. The source and drain contacts were then isolated by isotropic argon plasma etching (100 W, 20 min.). The example transfer curves from these devices are presented in FIGS. 4 and 5.

The calculated parameters for both linear and nanoparticle PBTTT transistors are presented in Table 10.

TABLE 10

Mobility, on/off current ratio, and threshold voltage of nanoparticle and linear PBTTT transistors as extracted from the transfer curve in the saturation regime.

|  | $\mu$/cm$^2$ V$^{-1}$ s$^{-1}$ | $I_{ON/OFF}$ | Vt/V |
|---|---|---|---|
| Nanoparticle PBTTT | $2.82 \times 10^{-3}$ | 10 | −3.76 |
| Linear PBTTT | $1.86 \times 10^{-2}$ | 28 | 3.22 |

REFERENCES (1) McCulloch, I.; Heeney, M.; Bailey, C.; Genevicius, K.; MacDonald, I.; Shkunov, M.; Sparrowe, D.; Tierney, S.; Wagner, R.; Zhang, W.; Chabinyc, M. L.; Kline, R. J.; McGehee, M. D.; Toney, M. F. *Nat. Mater.* 2006, 5, 328.
(2) Li, J.; Zhao, Y.; Tan, H. S.; Guo, Y.; Di, C.-A.; Yu, G.; Liu, Y.; Lin, M.; Lim, S. H.; Zhou, Y.; Su, H.; Ong, B. S. *Sci. Rep.* 2012.

The invention claimed is:

1. An aqueous composition comprising a plurality of nanoparticles dispersed in an aqueous medium, wherein:
   (i) the nanoparticles comprise a core formed from one or more non-cross-linked organic π-conjugated polymers;
   (ii) the nanoparticles have a particle size of less than 400 nm; and
   (iii) the concentration of the nanoparticles in the aqueous medium is greater than or equal to 12 mM;
   and wherein the non-cross-linked organic π-conjugated polymers are intrinsic semi-conductors that do not comprise any carbon-carbon triple bonds.

2. An aqueous composition according to claim 1, wherein the core of the nanoparticles consists essentially of the one or more non-cross-linked organic π-conjugated polymers.

3. An aqueous composition according to claim 1, wherein the polymeric backbone of the non-cross-linked organic π-conjugated polymer is uncharged.

4. An aqueous composition according to claim 1, wherein core of the nanoparticles are coated with a stabiliser.

5. An aqueous composition according to claim 1, wherein the monomeric units present in the non-cross-linked π-conjugated polymers are selected from the group consisting of:

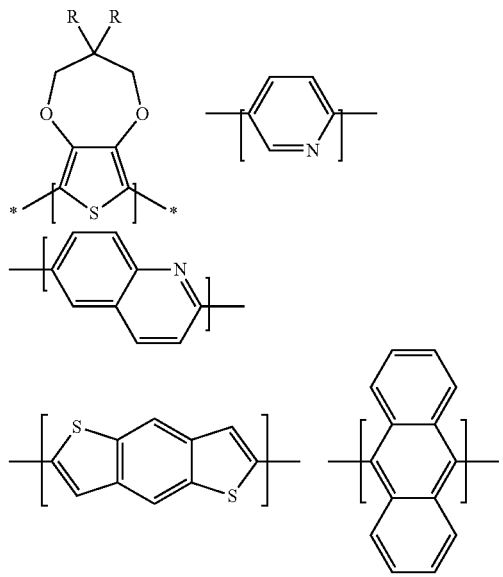

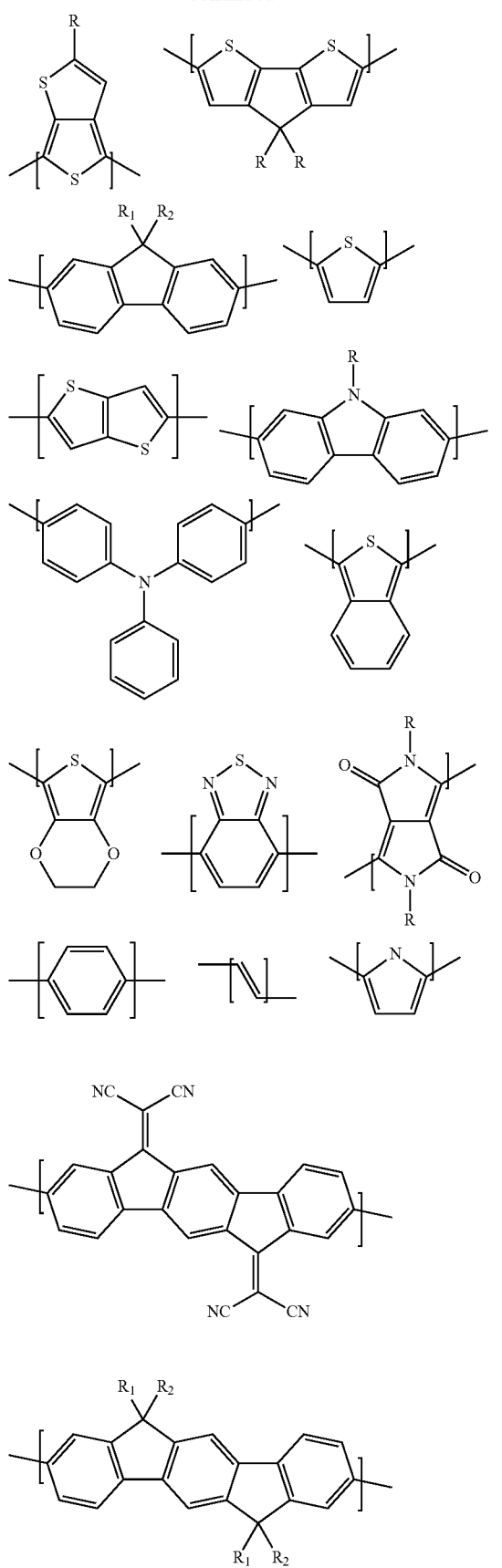
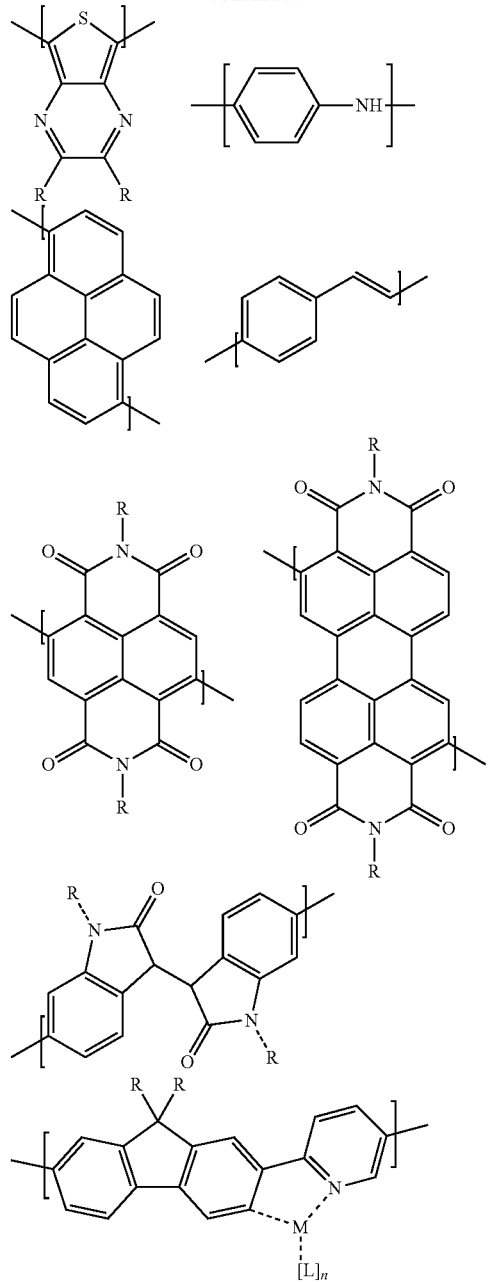

wherein R, $R_1$ and $R_2$ are hydrogen or organic substituent groups (e.g. a hydrocarbyl substituent group optionally comprising 1 to 30 carbon atoms and optionally comprising one or more heteroatoms (e.g. N, O, S, Si, or P), or an aromatic or heteroaromatic group);

M is a metal (e.g. Ir, Pt, Rh, Re, Ru, Os, Cr, Cu, Pd, or Au);

L is a ligand (e.g. a halide or a hydrocarbyl substituent group optionally comprising 1 to 30 carbon atoms and optionally comprising one or more heteroatoms (e.g. N, O, S, Si, or P) or an aromatic or hetroaromatic group);

and wherein each of the above structures is optionally further substituted with one or more organic substituent groups (e.g. a hydrocarbyl substituent groups optionally comprising 1 to 30 carbon atoms and optionally comprising one or more heteroatoms (e.g. N, O, S, Si, or P) or an aromatic or heteroaromatic group).

6. An aqueous composition according to claim 1, wherein the monomeric units present in the non-cross-linked organic π-conjugated polymers are selected from the group consisting of:

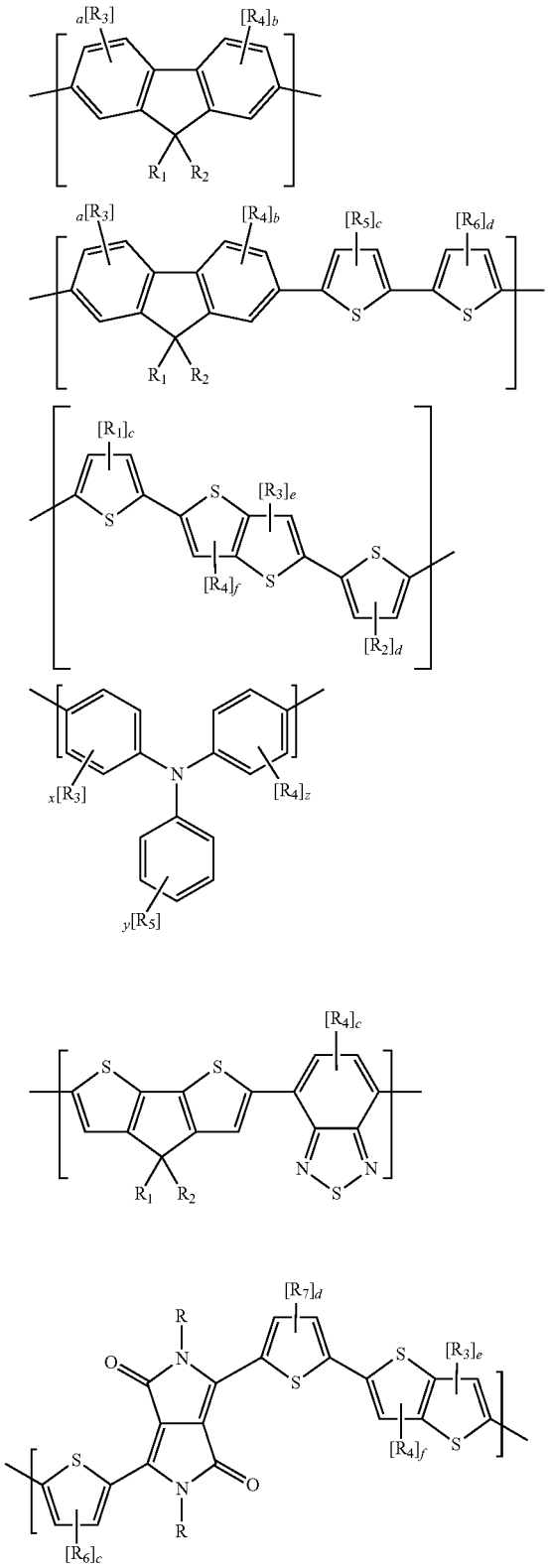

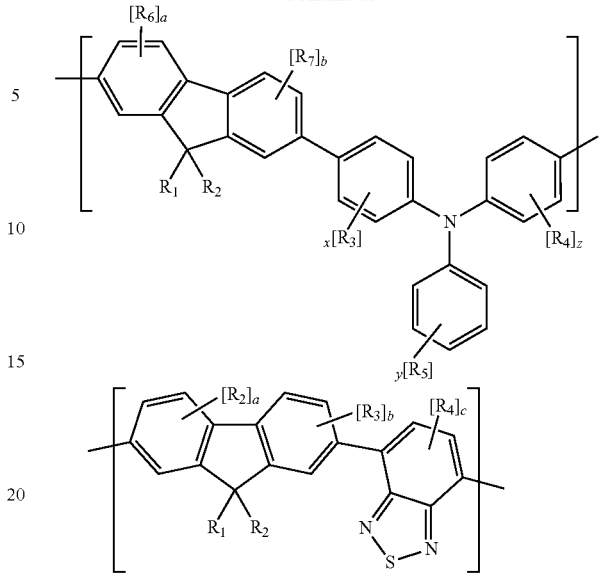

wherein R, $R_1$, $R_2$, $R_3$, $R_4$, $R_5$, $R_6$ and $R_7$ are each independently selected from hydrogen or a hydrocarbyl substituent group comprising 1 to 30 carbon atoms and optionally comprising one or more heteroatoms (e.g. N, O, S, Si, or P);

a is 0, 1, 2 or 3; b is 0, 1, 2 or 3; c and d are 0, 1 or 2; e and f are 0 or 1; x is 0, 1, 2, 3 or 4; y is 0, 1, 2, 3 or 4; and z is 0, 1, 2, 3 or 4.

7. An aqueous composition according to claim 1, wherein the aqueous medium is water.

8. An aqueous composition according to claim 1, wherein the size of the nanoparticles is within the range of 30 to 300 nm.

9. An aqueous composition according to claim 1, wherein the concentration of the nanoparticles in the aqueous medium is greater than or equal to 15 mM.

10. A method of forming an aqueous composition as claimed in claim 1, said method comprising:
   (i) forming the nanoparticles by emulsion polymerisation or miniemulsion polymerisation techniques to form an aqueous suspension of nanoparticles; and
   (ii) optionally purifying the nanoparticle suspension.

11. A method according to claim 10, wherein the nanoparticles are formed by a Stille or Suzuki polymerisation reaction.

12. Nanoparticles comprising one or more non-cross-linked organic π-conjugated polymers, wherein:
   (i) the nanoparticles are formed from one or more non-cross-linked organic π-conjugated having a solubility in an organic solvent [e.g. chlorobenzene at room temperature] of less than 10 mg/ml; and
   (ii) the nanoparticles have a particle size of less than 400 nm.

13. Nanoparticles according to claim 12, wherein the monomeric units present in the non-cross-linked π-conjugated polymers have the formula:

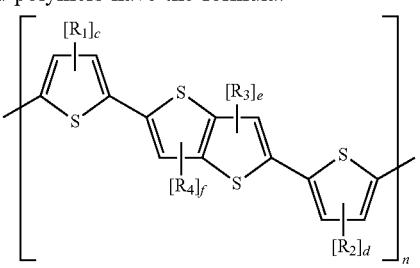

wherein $R_1$, $R_2$, $R_3$, and $R_4$ are each independently selected from hydrogen or a hydrocarbyl substituent group comprising 1 to 30 carbon atoms and optionally comprising one or more heteroatoms (e.g., N, O, S, Si, or P); and n is at least 1; c and d are 0, 1 or 2; and e and f are 0 or 1.

14. Nanoparticles according to claim 12, wherein the monomeric units present in the non-cross-linked π-conjugated polymers have the formula:

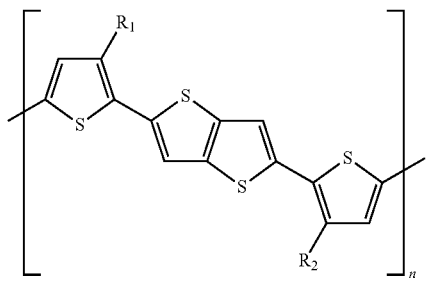

wherein $R_1$ and $R_2$ are each independently selected from hydrogen or a hydrocarbyl substituent group comprising 1 to 30 carbon atoms and optionally comprising one or more heteroatoms (e.g., N, O, S, Si, or P); and n is at least 1.

15. Nanoparticles according to claim 12, wherein the size of the nanoparticles is within the range of 30 to 300 nm.

16. A process for preparing an organic semi-conductor or photovoltaic device or component, said process comprising:
(i) depositing an aqueous composition comprising nanoparticles as defined in claim 1 onto a substrate; and
(ii) heating the substrate to a temperature above the glass transition temperature (Tg) of the nanoparticles to form a film of organic π-conjugated polymer on the substrate.

17. An organic semi-conductive film obtained by the process of claim 16.

18. An organic semi-conductor or photovoltaic device or component obtained by a process as defined in claim 16.

19. An organic semi-conductor or photovoltaic device or component comprising an organic semi-conductive film as claimed in claim 17.

* * * * *